(12) United States Patent
Vella et al.

(10) Patent No.: US 11,770,976 B2
(45) Date of Patent: Sep. 26, 2023

(54) ELECTRICAL COMPONENT

(71) Applicant: Xaar Technology Limited, Cambridge (GB)

(72) Inventors: Andrew Vella, Cambridge (GB); Peter Mardilovich, Cambridge (GB)

(73) Assignee: Xaar Technology Limited, Cambridge (GB)

( * ) Notice: Subject to any disclaimer, the term of this patent is extended or adjusted under 35 U.S.C. 154(b) by 10 days.

(21) Appl. No.: 17/294,207

(22) PCT Filed: Nov. 15, 2019

(86) PCT No.: PCT/GB2019/053250
§ 371 (c)(1),
(2) Date: May 14, 2021

(87) PCT Pub. No.: WO2020/099892
PCT Pub. Date: May 22, 2020

(65) Prior Publication Data
US 2022/0006001 A1  Jan. 6, 2022

(30) Foreign Application Priority Data

Nov. 15, 2018 (GB) ..................... 1818641

(51) Int. Cl.
*H10N 30/88* (2023.01)
*B41J 2/14* (2006.01)
(Continued)

(52) U.S. Cl.
CPC ........ *H10N 30/883* (2023.02); *B41J 2/14274* (2013.01); *H10N 30/10516* (2023.02); *H10N 39/00* (2023.02)

(58) Field of Classification Search
None
See application file for complete search history.

(56) References Cited

U.S. PATENT DOCUMENTS 6,930,438 B2  8/2005  Cramer et al.
7,527,356 B2  5/2009  Sato
(Continued)

FOREIGN PATENT DOCUMENTS

CN  1528023 A  9/2004
CN  1830668 A  9/2006
(Continued)

OTHER PUBLICATIONS

Search Report dated Apr. 5, 2019, in the corresponding United Kingdom Application No. 1818641.1.
(Continued)

*Primary Examiner* — Erica S Lin
(74) *Attorney, Agent, or Firm* — Honigman LLP; Eric J. Sosenko; Jonathan P. O'Brien

(57) ABSTRACT

The present invention relates to an electrical component for a microelectromechanical systems (MEMS) device, in particular, but not limited to, an electromechanical actuator. In one aspect, the present invention provides an electrical component for a microelectromechanical systems device comprising: i) a substrate layer; ii) a plurality of adjacent electrical elements arranged over the substrate layer, where each electrical element is separated from a neighbouring electrical element by an intermediate region, each of the plurality of electrical elements comprising: a) a ceramic member; and b) first and second electrodes disposed adjacent the ceramic member such that a potential difference may be established between the first and second electrodes and through the ceramic member during operation; iii) a passivation layer, or a laminate of multiple passivation layers, at least partially overlying each of the plurality of electrical elements so as to provide electrical passivation between the first and second electrodes of each of the plurality of electrical elements; wherein the passivation (Continued)

layer, or at least an innermost layer of the laminate of passivation layers which is disposed adjacent each underlying electrical element, is discontinuous over at least one intermediate region between neighbouring electrical elements of the electrical component.

20 Claims, 11 Drawing Sheets

(51) Int. Cl.
*H10N 30/00* (2023.01)
*H10N 39/00* (2023.01)

(56) References Cited

U.S. PATENT DOCUMENTS

| | | |
|---|---|---|
| 8,322,830 B2 | 12/2012 | Takakuwa |
| 10,391,770 B2 | 8/2019 | Hayashi |
| 2004/0051763 A1 | 3/2004 | Matsubara et al. |
| 2011/0198970 A1* | 8/2011 | Martin .............. H01L 41/0533 29/25.35 |
| 2012/0320131 A1 | 12/2012 | Kato et al. |
| 2014/0307034 A1 | 10/2014 | Kojima |
| 2016/0043299 A1 | 2/2016 | Fujimori et al. |
| 2017/0197415 A1 | 7/2017 | Shinkai et al. |
| 2017/0253039 A1 | 9/2017 | Kimura et al. |
| 2018/0194134 A1 | 7/2018 | Kawakubo et al. |
| 2018/0264809 A1 | 9/2018 | Mizukami |

FOREIGN PATENT DOCUMENTS

| | | | |
|---|---|---|---|
| CN | 102825911 A | 12/2012 | |
| CN | 108698407 A | 10/2018 | |
| EP | 3213923 A1 | 9/2017 | |
| JP | 2008244266 A | 10/2008 | |
| JP | 2016054200 A | 4/2014 | |
| WO | 2014/003768 A1 | 1/2014 | |
| WO | WO-2016156792 A1 * | 10/2016 | .......... B41J 2/14233 |

OTHER PUBLICATIONS

International Search Report dated Feb. 13, 2020, in International Application No. PCT/GB2019/053250.

* cited by examiner

ELECTRICAL COMPONENT

CROSS REFERENCE TO RELATED APPLICATIONS

This application is a national stage entry of international application no. PCT/GB2019/053250, filed Nov. 15, 2019, which is based on and claims the benefit of foreign priority under 35 U.S.C. 119 to GB 1818641.1, filed Nov. 15, 2018. Where permissible, the entire contents of the above-referenced applications are herein expressly incorporated by reference.

The present invention relates to an electrical component for a microelectromechanical systems (MEMS) device, in particular, but not limited to, an electromechanical actuator. It may find particularly beneficial application as an actuator component for a droplet ejection head, such as an inkjet printhead.

Droplet ejection heads are now in widespread usage, whether in more traditional applications, such as inkjet printing, or in 3D printing, or other materials deposition or rapid prototyping techniques. Accordingly, the fluids used may have novel chemical properties to adhere to new substrates and increase the functionality of the deposited material.

Recently, inkjet printheads have been developed that are capable of depositing ink directly onto ceramic tiles, with high reliability and throughput. This allows the patterns on the tiles to be customized to a customer's exact specifications, as well as reducing the need for a full range of tiles to be kept in stock.

In other applications, inkjet printheads have been developed that are capable of depositing ink directly on to textiles. As with ceramics applications, this may allow the patterns on the textiles to be customized to a customer's exact specifications, as well as reducing the need for a full range of printed textiles to be kept in stock.

In still other applications, droplet ejection heads may be used to form elements such as colour filters in LCD or OLED elements displays used in flat-screen television manufacturing. So as to be suitable for new and/or increasingly challenging applications, droplet ejection heads continue to evolve and specialise. However, while a great many developments have been made, there remains room for improvements in the field of droplet ejection heads.

Electrical elements for MEMS devices are commonly manufactured through the deposition of a series of layers arranged on a substrate, for example through one or more techniques known in the thin film technology field. A typical electrical element may have a configuration where a thin film of a ceramic material showing ferroelectric behaviour, for example a piezoelectric material and a relaxor/ferroelectric crossover material, is interposed between two electrically conductive layers, a lower electrode and a top electrode. Such an electrical element is deposited layer by layer on a substrate, commonly a wafer accommodating several arrays of electrical elements. The lower electrode may be a common electrode or may be patterned to form arrays of individual electrodes, each associated with an individual electrical element, whilst the thin film material, as well, may or may not be patterned. Individual electrical elements, therefore, might comprise a patterned ceramic material thin film or a region of an unpatterned "common" ceramic material thin film. Individually addressable regions of the electrical elements may be defined by at least one of the electrodes being patterned such as to be individual to each electrical element.

In other cases an electrical element may have an electrode configuration in which first and second electrodes are instead provided on one surface of the ceramic thin film, for example, as an adjacent or interdigitated pair. This electrode arrangement has the advantage of providing an easier way of connecting the electrodes since they are on the same surface so the manufacture of the electrical component is simplified. It is particularly useful for some applications, for example sensors.

Electrical connection of the electrical element to the drive circuitry may be ensured through the use of metal traces that are directly connected to the electrodes of the electrical element.

Commonly employed ceramic materials include lead based ceramics with perovskite structure, especially lead titanate zirconate (PZT), doped PZT and PZT based solid solutions. They may be deposited onto the substrate through a number of deposition techniques known in the art, for example, sputtering, chemical vapour deposition (CVD), chemical solution deposition (CSD).

In recent years significant effort has been put into the development of lead-free alternative materials such as (K,Na)NbO3-based materials, (Ba,Ca)(Zr,Ti)O3-based materials and (Bi,Na,K)TiO3-based materials.

One challenge of providing a reliable electrical element is to ensure proper passivation between the electrodes of individual electrical elements, protection of the individual piezoelectric members and insulation of an electrical component, as a whole, from the external environment especially humidity and chemicals that my cause short circuits and/or corrosion and/or degradation of the electrical component which may, eventually, lead to unrecoverable failure of the electrical component.

The ceramic material typically is not a good conductor of electricity. Where for example at least the lower electrode and ceramic material are patterned to the same shape, with either a common or similarly patterned upper electrode, paths for shorts can be present along the edge profile of the patterned areas. The piezoelectric members themselves are susceptible of chemical attack that can lead to a degradation of the piezoelectric and electrical properties of the material. Moreover, etch-damaged piezoelectric members may be particularly vulnerable and offer paths for a chemical attack to diffuse further internally in the piezoelectric member. This necessitates the use of additional, electrically passivating layers that ensure electric isolation between the two electrodes and at the same time protection of the piezoelectric member.

Therefore, one or more passivation layers may be deposited on at least part of the electrical element. Adequate protection of the electrical element must be balanced with the inhibitive effect of such passivation layers on the performance of the electrical element, particularly the extent of the displacement of electrostrictive/piezoelectric components of electrical elements. This is particularly relevant when the passivation extends over the whole electrical element. Thicker passivation layers perform well in providing electric passivation, but can more readily suppress the electrostrictive/piezoelectric performance. Meanwhile, thinner passivation layers may not provide adequate protection.

As is well known to the skilled person, commonly used methods of deposition of passivation coatings very rarely produce defect-free layers. Moreover, residual stress determined by the nature of the material and the method of deposition may be responsible for localised micro-cracks in any of the passivation layers. Once again, thicker layers may be characterised by a lower density of defects with respect to thinner layers but they have a negative impact on the displacement of the electrical element.

Moreover, in the process for the manufacture of the electrical component including the one or more electrical elements thereof, manufacturing steps requiring the use of etchants may be necessary.

During operation, as well, many different kinds of fluids, including moisture, may be present in a device where the electrical component is being used. There is a possibility, therefore, of the electrical component coming into contact with chemicals during the manufacturing steps and/or during operation. Furthermore there may be humidity and/or harmful chemicals present in the external environment during manufacture and/or during operation.

To protect the electrical component from the external environment and from chemicals, electrical components known in the art may be provided with a capping layer bonded to the substrate on the same side upon which one or more electrical elements are formed. The capping layer may be adapted to enclose each electrical element, after the deposition of the passivation structure, and to protect it from the external environment. For example a capping layer may have cavities which may be formed by etching or other suitable technique, so that, once the capping layer is bonded to the electrical component, it can enclose each of the one or more electrical elements.

Unpredictable imperfections may be present in the bonding, for example a layer of bonding material, between the capping layer and the electric component where the one or more electrical elements are formed. For example, voids due to an uneven topography, pinholes or micro-cracks. Such defects may cause leaks of chemicals through the capping layer and towards the one or more electrical elements.

The problem of leaks through the bonding of the capping layer may be exacerbated by the presence of randomly distributed defects in the form of pinholes or micro-cracks in the passivation structure. Those defects may be difficult to avoid, as well as to identify and mend and they constitute weakness spots that may provide paths for chemicals to find their way to the one or more electrical elements. The contact of chemicals with the electrical features of the one or more electrical elements, may cause corrosion, shorts and, eventually, fatal failure of the one or more electrical elements.

Failure of one electrical element, in an arrangement of electrical elements incorporated within the same electrical component, may lead to complete component failure, even when a continuous layer of passivation, overlies the failed electrical element and the neighbouring electrical elements. A cascade of failure events may originate from the failure of a single electrical element through, for instance, the corrosion of a common passivation layer.

Historically, continuous layers of alumina, alone or in combination with other material layers, have been preferentially used for achieving passivation between electrodes of electrical elements for use in MEMs applications, particularly those comprising lead zirconate titanate (PZT) based piezoelectric elements. Alumina is particularly effective in terms of protection of PZT (particularly etch-damaged PZT) from the external environment during processing and operation of the electrical component as well as in terms of adhesion to the PZT. However, alumina may be particularly susceptible to chemical attack, for example, in some environments, such as aqueous environments, and/or as a result of moisture/chemicals ingress from the external environment which may be due to non-ideal bonding of the capping layer.

One or more intermediate layers of material may also be provided between the lower electrode and the substrate to improve the properties of the electrical component, for instance by improving adhesion of the lower electrode to the underlying layers. Such intermediate layers may also be used as diffusion barriers, for instance to prevent diffusion of lead ions from a PZT ceramic material to the substrate. Diffusion of ions, such as lead ions from a PZT ceramic material, alters the stoichiometric balance of the ceramic material and degrade its piezoelectric performance. Diffusion of ions into underlying layers can also lead to failure of the substrate. Alumina may suitably be used for the purpose of forming the intermediate layer, or one of the intermediate layers, since it is effective at both improving adhesion and acting as a barrier to ion diffusion, particularly lead ions, but these desirable properties must also be balanced against its susceptibility to chemical attack.

Failure of individual electrical elements of an electrical component may be compensated for (e.g. by adjusting waveform to adjacent functional electrical elements) to extend device lifetime. However, this compensation to retain device functionality has historically not been possible where continuous passivation layers with a high susceptibility to chemical attack are used. This weakness may then be compounded where non-ideal bonding is present at the capping layer, which increases the likelihood of chemical attack from the external environment.

Previous solutions to the problem of providing protection from the external environment include the use of two moisture barrier layers, as described in US2017/0253039. That document describes a MEMs device which is protected using two moisture barrier layers which are arranged over actuating elements having individual upper electrodes and a common bottom electrode arranged in a stack. The moisture barrier layers have different Young's modulus, thickness, composition and permeability to moisture.

For example, US 2017/0253039 teaches a first moisture resistant layer which is thicker than the second moisture resistant layer, has a lower Young's modulus, and is preferably composed of a polyimide. The thinner second moisture resistant layer is preferably formed of metal, which has a low diffusivity to moisture and whose relative thinness is said to allow for deformation of the piezoelectric layer of the actuating element.

US 2017/0253039 generally discloses embodiments where the first and second moisture resistant layers are continuous layers covering the regions between neighbouring actuating elements. However, the option that the moisture resistant layers are discontinuous in the regions between neighbouring actuating elements is also described (paragraph [0074]), where appropriate protection of the actuating elements from moisture may be retained where the side surface (lateral edges) of the piezoelectric layers are still covered by the moisture resistant layers.

US 2017/0253039 does not describe the use of passivation layers to ensure electrical passivation of the electrodes and also does not acknowledge any problem associated with actuating element failure resulting from chemical attack and failure of passivation layers associated with the electrical elements.

There remains a need for providing alternative insulated electrical components for MEMs devices which provide adequate protection to the electrical elements of the component from the external environment, particularly from chemical attack, whilst at the same time accommodating for the deformation of electrostrictive/piezoelectric components of the electrical elements and/or providing means for extending device lifetime, even in the case of individual electrical element failure.

The present invention includes the use of a discontinuous passivation layer for providing electrical passivation between electrodes of individual electrical elements and protection of the piezoelectric members of an electrical component, where the electrical component comprises a plurality of electrical elements. Alternatively or additionally, discontinuity in one or more intermediate layers which underlie the electrical elements, if present, may be provided in addition to or in place of the discontinuity in an overlying passivation layer, the discontinuity being provided such that any intermediate layer is discontinuous over the intermediate region between neighbouring electrical elements. The particular features of the discontinuity in the passivation layer and/or the intermediate layer enables effective passivation to be achieved whilst preventing cascading failure mechanisms through at least partial isolation of the passivation layer and/or intermediate layer associated with individual electrical elements.

SUMMARY OF THE INVENTION

In a first aspect, the present invention provides an electrical component for a microelectromechanical systems device comprising: i) a substrate layer; ii) a plurality of adjacent electrical elements arranged over the substrate layer, where each electrical element is separated from a neighbouring electrical element by an intermediate region, each of the plurality of electrical elements comprising: a) a ceramic member; and b) first and second electrodes disposed adjacent the ceramic member such that a potential difference may be established between the first and second electrodes and through the ceramic member during operation; iii) a passivation layer, or a laminate of multiple passivation layers, at least partially overlying each of the plurality of electrical elements so as to provide electrical passivation between the first and second electrodes of each of the plurality of electrical elements; wherein the passivation layer, or at least an innermost layer of the laminate of passivation layers which is disposed adjacent each underlying electrical element, is discontinuous over at least one intermediate region between neighbouring electrical elements of the electrical component.

In a second aspect the present invention provides an electrical component for a microelectromechanical systems device comprising: i) a substrate layer; ii) a plurality of adjacent electrical elements arranged over the substrate layer, where each electrical element is separated from a neighbouring electrical element by an intermediate region, each of the plurality of electrical elements comprising: a) a ceramic member; and b) first and second electrodes disposed adjacent the ceramic member such that a potential difference may be established between the first and second electrodes and through the ceramic member during operation; iii) an intermediate layer disposed adjacent to the electrical element and at least partially interposed between each electrical element and the substrate layer; wherein the intermediate layer is discontinuous over at least one intermediate region between neighbouring electrical elements of the electrical component.

In a third aspect, the present invention provides an electrical component according to the first and/or second aspect, wherein the electrical component is an actuator component for use in a droplet ejection apparatus.

In a fourth aspect, the present invention provides a microelectromechanical system device comprising an electrical component according to the first, second or third aspect and a capping layer attached to the electrical component. The capping layer may define a single cavity for groups of, or all of the electrical elements, or may define a respective cavity for each electrical element. Such cavities may be sealed in a fluid-tight manner.

In a fifth aspect, the present invention provides a droplet ejection head comprising an electrical component according to the first, second or third aspect or a device according to the fourth aspect.

In a sixth aspect, the present invention provides a droplet ejection apparatus comprising a droplet ejection head according to the fifth aspect.

BRIEF DESCRIPTION OF THE DRAWINGS

FIG. 3(c)(i) depicts a top view of a portion of an electrical component at a later step during manufacture than in FIGS. 3(a-b) according to a test design;

FIG. 3(c)(ii) depicts a top view of a portion of an electrical component at the same step during manufacture as FIG. 3(c)(i) for a first embodiment of the disclosure;

Figure 1A:
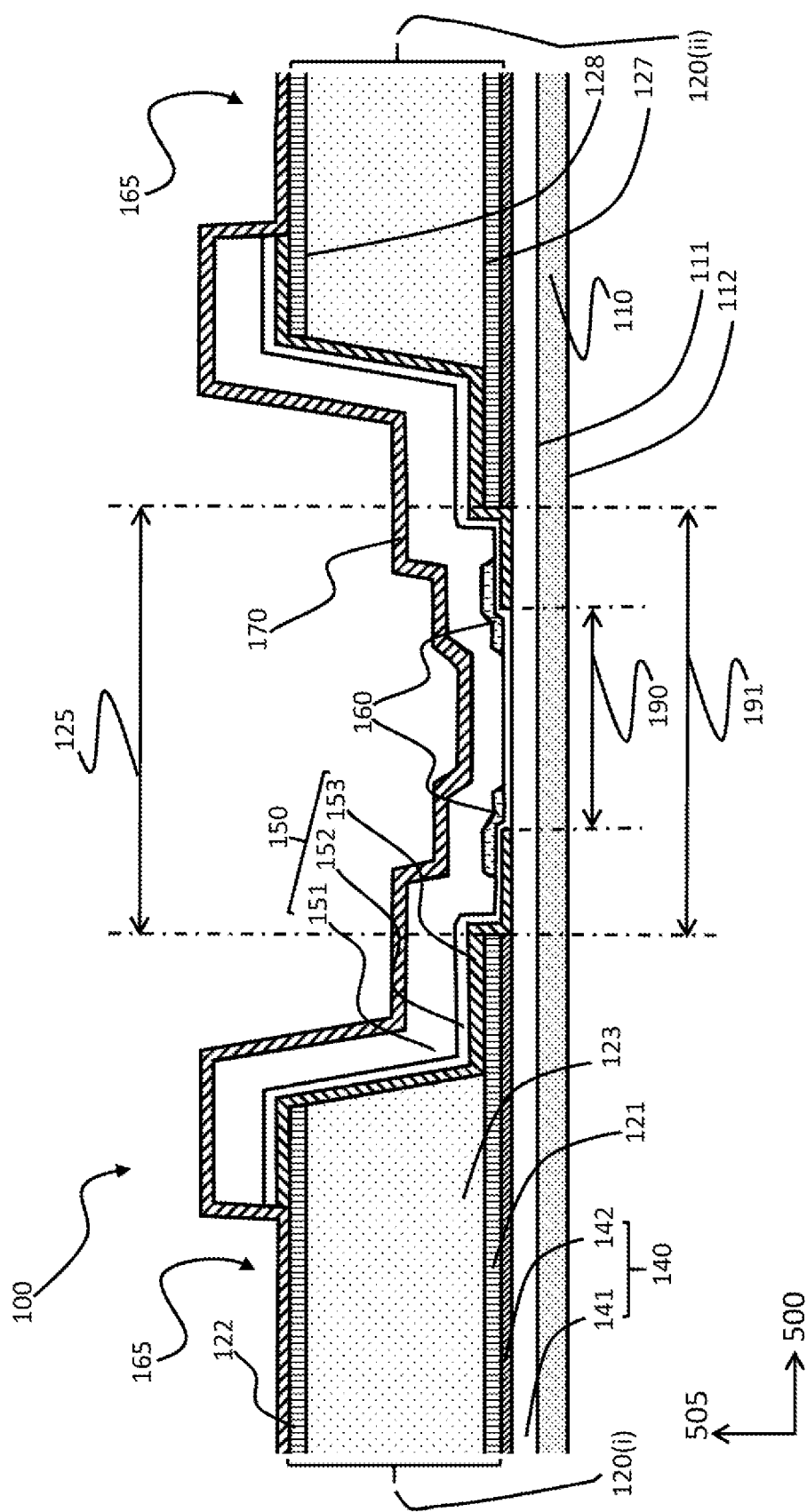
FIG. 1(a) is a schematic diagram of a cross-section through a portion of an electrical component according to a first embodiment of the disclosure where there is a discontinuous region in the innermost layer of the laminate of passivation layers over an intermediate region, a discontinuous region in the intermediate layer underlying the first electrode and a discontinuous window over the electrical elements.

It should be noted that the drawings are not to scale and that certain features may be shown with exaggerated sizes so that these are more clearly visible.

DETAILED DESCRIPTION OF THE INVENTION

The electrical component for a MEMS device of the first aspect comprises a substrate layer comprising first and second sides spaced apart in a thickness direction, wherein one or more electrical elements are arranged over the first side of the substrate layer.

The material of the substrate layer is not particularly limited. The substrate layer may be a silicon wafer or in other examples the substrate may be made of stainless steel, magnesium oxide (MgO), glass, nickel or the like. The substrate layer may be a laminate of two or more layers, where different layers may have the same or different composition. In some embodiments, the substrate comprises an uppermost layer which is in contact with the electrical element and which comprises silicon oxide, silicon nitride or the like. One or more lower layers of the laminate may be different from the uppermost layer and, for example, may comprise silicon wafer, MgO, stainless steel, glass or the like.

One or more intermediate layers may be interposed between the one or more electrical elements and the substrate layer, including, but not limited to, a membrane layer or stack of membrane layers (e.g. vibrating plates) that deform under the action of the electrical element; stress gradient mitigating layers; barrier layers for preventing diffusion of ions between the ceramic member and the substrate; and/or adhesion layers to improve adhesion of the electrical elements to the substrate. Such additional layers may comprise for example inorganic oxide or nitride layers, such as alumina, silica, silicon nitride, zirconia, tantala, hafnia and the like.

A membrane layer, or stack of membrane layers, may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), titanium oxide ($TiO_2$), silicon (Si), hafnia ($HfO_2$) or silicon carbide (SiC).

Stress gradient mitigating layers typically comprise silicon nitride, TEOS derived silica or other material layers whose Young's modulus is intermediate with respect to the Young modulus of the substrate and that of the electrical element, determined based on the Young modulus of its individual layers.

The one or more intermediate layers may, in some instances, be considered to form part of the substrate itself (i.e. a multi-layer substrate) or additional layers may be added to the substrate to form a modified multi-layer substrate. Any substrate configuration suitable for use in MEMS applications may be used in connection with the present application.

Each electrical element which is arranged over the substrate comprises a thin film ceramic member and first and second electrodes disposed adjacent the ceramic member such that a potential difference may be established between the first and second electrodes and through the ceramic member during operation.

In some embodiments, the ceramic member and first and second electrodes are arranged in a stack of layers, each having lateral surfaces extending in a thickness direction, wherein the ceramic member has a first side and an opposing second side spaced apart in a thickness direction. The first side of the ceramic member faces the substrate layer and the first electrode is disposed adjacent the first side of the ceramic member so as to interpose the substrate layer and the ceramic member and the second electrode is disposed adjacent to the second side of the ceramic member.

The stack of layers, typically formed from sequential depositions, may be patterned, for instance, through etching. The patterning may be carried out in one or more steps. For example, the thin film ceramic member may be patterned first, followed by exposed regions of the underlying first electrode in separate patterning steps. Alternatively, the thin film ceramic member and first electrode may be patterned in a single step. Where the second electrode is patterned, the second electrode may be patterned first and then exposed regions of the underlying ceramic thin film member and the first electrode may be patterned together in one step or separately in successive steps.

The patterning steps can be carried out according to any process known in the art, for example by dry etching or wet etching. Preferably the patterning is carried out through dry etch using chlorine ($Cl_2$) and argon (Ar) in suitable ratio for a suitable period of time, such as in the range from 30 seconds to 5 minutes or 1 to 3 minutes, for example 2 minutes, over a suitable number of cycles, such as 1 to 10 cycles or 3 to 5 cycles, for example 4 cycles.

In alternative embodiments, the thin film ceramic member interposes the first and second electrodes in a direction perpendicular to a thickness direction of the electrical element. In those embodiments, the first and second electrodes may be deposited on lateral external surfaces of the thin film ceramic member, opposing each other in a direction substantially perpendicular to the thickness direction.

In other embodiments the first and second electrodes may be deposited adjacent to the thin film ceramic member and on the same surface of the thin film ceramic member, which surface may be opposite to the surface facing the substrate, in the thin film thickness direction. In such embodiments, first and second electrodes are formed as interdigitated electrodes each preferably comprising a plurality of electrode fingers. Alternatively, said interdigitated electrodes are deposited in slots formed in the thin film ceramic member in the thickness direction so that each digit is, at least in part, surrounded by the ceramic material.

In other embodiments, the first and second electrodes are deposited as interdigitated electrodes on the substrate before the deposition of the thin film ceramic member. When first and second electrodes are formed as interdigitated electrodes a potential difference may be established between the first and second electrode, through the thin film ceramic member regardless of the specific arrangement or specific location, provided that the first and second electrodes are disposed adjacent to the thin film ceramic member.

The first and second electrodes employed in the one or more electrical elements of the present invention are not particularly limited. Suitably, the first and/or second electrodes are layers of platinum (Pt), iridium (Ir), iridium oxide ($IrO_2$), ruthenium (Ru), lanthanum nikelate ($LaNiO_3$), strontium ruthenate ($SrRuO_3$), or combinations thereof. The first and second electrodes may be formed of the same or different materials. In some embodiments, both first and second electrodes comprise platinum. Platinum is particularly preferred as a result of its high conductivity and high chemical stability, as well as its resistance to oxidation in oxygen environments at high temperatures.

The electrodes may be formed using any suitable technique known in the art, such as sputtering, and various forms of physical or chemical vapour deposition techniques (PVD and CVD), electroplating or any other suitable technique.

The ceramic material of the ceramic member of each of the one or more electrical elements of the invention is not particularly limited provided it exhibits ferroelectric behaviour, for instance piezoelectric or ferroelectric/crossover properties that make it suitable for use in MEMS applications.

The ceramic material of the thin film ceramic member may comprise a ceramic material with a major proportion of a perovskite crystallographic phase (i.e. above 50 vol. %), preferably at least 90 vol. % perovskite crystallographic phase, more preferably at least 95 vol. % piezoelectric crystallographic phase. Most preferably, the ceramic material is substantially homogeneous (i.e. phase pure), having only a perovskite crystalline phase.

In some embodiments, the ceramic material of the electrical element of the invention comprises lead, titanium, zirconium, niobium and/or zinc ions. Examples of lead-based ceramic materials that may be used in accordance with the present invention include $Pb[Zr_xTi_{1-x}]O_3$ ($0 \leq x \leq 1$), $Pb[(Zn_{1/3}Nb_{2/3})_xTi_{1-x}]O_3$ $0<x<1$, and $Pb[(Mg_{1/3}Nb_{2/3})_xTi_{1-x}]O_3$ ($0<x<1$).

In other embodiments the ceramic material may be lead-free and/or contain bismuth, sodium and/or potassium ions, and may preferably be selected from one or more of $(Bi_{0.5}Na_{0.5})TiO_3$, $(Bi_{0.5}K_{0.5})TiO_3$, $Bi(Mg_{0.5}Ti_{0.5})O_3$, $(K_{0.5}Na_{0.5})NbO_3$, $BiFeO_3$ and solid solutions comprising combinations thereof.

The ceramic member of each of the one or more electrical elements of the present invention may comprise one or more thin film layers. Preparation of the ceramic thin films layers for MEMS applications typically involves chemical solution deposition using chemical solution precursors, or sputtering (e.g. RF magnetron sputtering) using solid state sintered or hot-pressed ceramic targets. Any other suitable method of preparation known in the art may also be used. The ceramic material thin film is preferably formed through chemical solution deposition.

For example, a multi-layer thin film ceramic member may be formed by means of multiple rounds of deposition and drying of precursor solution for the ceramic material, with crystallisation between each set of deposition and drying steps, or with only a single crystallisation step at the end of multiple rounds of deposition and drying. As will be appreciated, the composition of each of the layers of a multi-layer thin film ceramic member may be substantially identical. Alternatively, the composition of individual layers of a multi-layer thin film ceramic member may be optimised depending on whether, for instance, one of those layers will be in contact with the substrate and/or an electrode of the electrical element. Thus, in such embodiments, the composition of individual layers of a multi-layer thin film ceramic material may be different.

It is well-known that Pb, Bi, Na, and K are all volatile species, particularly at process temperatures typical of perovskite crystallisation. To compensate for the high volatility of certain cations, precursor solutions may be prepared with amounts of excess cations added thereto. Providing cation excess can ensure that the desired stoichiometry is achieved and help reduce stoichiometric imbalance and point defects. Such excess of cationic species is common in CSD-prepared PZT thin films (for example, up to 20 mol %-40 mol % excess $Pb^{2+}$ can be added, depending on solution chemistry). In a similar manner, bismuth cation precursor solutions, as well as precursor solutions of other cations, particularly those comprising sodium and potassium, may be prepared with an appropriate level of cation excess as may be determined by the skilled person by routine experimentation.

As will be appreciated by the skilled person, where there is a plurality of electrical elements in the electrical component, the ceramic member may initially be deposited before being patterned and segmented, for instance by etching, into multiple separated ceramic members, each associated with an individual one of the plurality of electrical elements.

Each of the one or more electrical elements is provided with a discontinuous passivation layer, or laminate of multiple passivation layers. The passivation layer, or laminate of multiple passivation layers, is disposed adjacent to the one or more electrical elements so as to provide electrical passivation between the first and second electrodes of each of the one or more electrical elements and protection of the piezoelectric member.

The term "laminate of multiple passivation layers" is intended to refer to a plurality of overlaid passivation layers which are stacked in a thickness direction, wherein adjacent passivation layers are differentiated from each other either based on having different compositions, for example to the extent that each layer comprises a different major component (e.g. where major means above 50 vol. %), and/or by the presence of at least partially interposing intermediate layers which physically separate passivation layers, which passivation layers may or may not be of substantially the same composition. For example, as described herein, electrical traces may be incorporated between passivation layers of substantially the same composition. The presence of the interposing electrical traces in this case at least partially separates the layers such that they are distinguished over the cross-section, even if they have substantially the same composition.

As will be appreciated, the thickness of individual passivation layers, including at least partially interposing intermediate layers, may vary in the direction substantially perpendicular to the thickness direction across the electrical component. It will also be appreciated that individual layers of the laminate of passivation layers may themselves be formed from several overlaid sub-layers resulting, for instance, from multiple rounds of a deposition process. Such sub-layers are not, however, distinguished on the basis of composition, to the extent that each layer comprises a different major component as described for the laminate discussed above, and are not separated by any interposing layers, so as to be considered distinct layers in a laminate. In some implementations the composition of the sublayers may gradually vary in the thickness direction without the individual sublayers being clearly distinguished from each other. Similarly, where only a single passivation layer is provided instead of a laminate of multiple passivation layers, the single passivation layer may also comprise several sub-layers resulting, for instance, from multiple rounds of a deposition process.

The term "discontinuous" used herein in connection with the passivation layer, or laminate of multiple passivation layers, is intended to refer to a passivation layer, or at least an innermost layer, or all layers, of a laminate of passivation layers (the innermost layer being disposed adjacent the one or more electrical elements), which does not extend continuously to fully overlie the one or more electrical elements and/or other regions overlying the substrate. It will be understood that "discontinuity" or "discontinuous region(s)" used in connection with the passivation layer or laminate of passivation layers are synonymous.

The discontinuity or discontinuous region in the passivation layer, or laminate of passivation layers, may, for example, be in the form of holes/apertures in the layer(s). In some arrangements, holes/apertures in the passivation layer, or at least the innermost layer, or all layers, of a laminate, mean that the passivation layer, or at least the innermost layer of the laminate, does not overlie a portion of the intermediate regions between neighbouring electrical elements.

The term "intermediate region" referred to herein refers to a region of the electrical component lying between (i.e. interposing) neighbouring electrical elements arranged over the substrate. Depending on the arrangement of electrical elements over the substrate (e.g. in rows or offset-rows or a matrix), the intermediate regions will collectively track a course around the electrical elements arranged over the substrate, to the extent that the course interposes at least two neighbouring electrical elements. It will be appreciated that in the case of electrical elements located at the extremities of an arrangement of electrical elements of an electrical component (e.g. at one end of a row of elements), the intermediate regions will collectively track a course around the electrical elements but will not fully encircle those electrical elements at the extremities, since the intermediate regions only exist where at least two neighbouring electrical elements are interposed.

An intermediate region may thus extend, in a direction perpendicular to the thickness direction of the electrical component, from a lateral edge of one end of an electrical element to an oppositely facing lateral edge of one end of a neighbouring electrical element, where the lateral edge may be that of either the ceramic member or the first electrode (when the electrical element is arranged in a stack with the first electrode interposing the substrate and the ceramic member), whichever part of the electrical component extends furthest in a direction substantially perpendicular to the thickness direction over the substrate. The intermediate regions may thus be considered to be the valley regions between the peaks formed by the electrical components over the substrate.

The passivation layer, or laminate or passivation layers, comprises a discontinuity which overlies an intermediate region, the discontinuity may be at any area of the intermediate region, provided that electrical passivation between the first and second electrodes is maintained. The discontinuity may extend only partially or fully over an intermediate region between neighbouring electrical elements, although preferably the discontinuity extends so as to interpose neighbouring electrical elements along substantially the entire length of oppositely facing lateral edges of neighbouring electrical elements.

In preferred arrangements, the passivation layer, or at least the innermost layer, preferably all layers, of the laminate, incorporate discontinuous regions such that it is segmented into isolated regions (i.e. non-connected islands), wherein each of the one or more electrical elements has an isolated region of the passivation layer, or laminate of passivation layers, at least partially overlying it. In such an arrangement, intermediate regions between neighbouring electrical elements do not have the passivation layer, or at least the innermost layer of the laminate, extending completely thereover, thereby preventing one isolated region of the passivation layer, or at least the innermost layer of the laminate, being attached or in contact with another.

Providing discontinuity in the passivation layer, or at least the innermost passivation layer of a laminate of passivation layers, and particularly to the extent that complete segmentation is achieved forming isolated regions, has been found by the inventors to reduce or substantially prevent cascading failure mechanisms where chemical attack of a vulnerable passivation layer may occur and otherwise propagate throughout the passivation structure. The discontinuities break or disrupt such propagation pathways, avoiding cascading failure of multiple electrical elements. As will be appreciated, the discontinuity need not span the entire area of the intermediate region in order to be effective at reducing propagation of, for instance, dissolution over the passivation layer.

In addition, providing discontinuity in an intermediate layer interposing the electrical elements and the substrate, in combination with the discontinuity in the overlying passivation layer or laminate of passivation layer can also help avoid the problem of cascading failure mechanisms and extend device lifetime. Thus, in preferred embodiments, the passivation layer(s) will have a discontinuity in an intermediate region which also coincides with a discontinuous region in any underlying intermediate layers, both of which may be the product of the same or multiple etching steps.

In some embodiments, additional discontinuity in the passivation layer, or laminate of passivation layers, is provided in a region overlying each of the plurality of electrical elements. In preferred embodiments, the discontinuity/discontinuous region forms a window through to each of the plurality of underlying electrical elements. The presence of a window means that at least part of the underlying electrical element is not overlaid by the passivation layer across the area of the window. This arrangement has been found by the inventors to be particularly advantageous in mitigating the negative impact of the passivation layer, or laminate of multiple passivation layers, on the displacement of the electrical element during operation, thereby preventing or reducing any inhibitive effect on the piezoelectric/electrostrictive performance of the ceramic member, whilst still ensuring adequate electrical passivation between the first and second electrodes of the electrical element.

In some embodiments, where a laminate of multiple passivation layers is provided, the laminate of passivation layers is recessed at a side which faces away from each of the underlying electrical elements, wherein a recess is provided in a region overlying each of the plurality of electrical elements, such that the one or more outermost passivation layers of the laminate of multiple passivation layers, is removed in a thickness direction across the recess. One or more innermost passivation layers are left overlying the one or more electrical elements across the recess. Recessing in this manner has also been found to have a beneficial effect in reducing the inhibitory effects of the passivation layers on the displacement of the electrical element during operation.

The term "recess" used herein in connection with a laminate of multiple passivation layers is intended to refer to a well or cavity in the laminate, penetrating through at least one layer, but not all layers, of a laminate of passivation layers, at the surface of the laminate which faces away from the underlying electrical elements. It will be understood that one or more of the innermost passivation layers of the laminate of passivation layers is/are left overlying each of the electrical elements across the recess. The recess may extend (in a plane perpendicular to the thickness direction) across a portion, preferably all, of the ceramic member of each of the plurality of electrical elements, so long as appropriate passivation of the electrodes of the plurality of electrical elements, and any traces connected thereto, is ensured.

Any suitable size of recess may be used which reduces an inhibitory effect of the passivation layer on the displacement of the one or more electrical elements. As will be appreciated, a discontinuity in the form of a window in the passivation layer or laminate of passivation layers overlying the electrical elements as described hereinbefore achieves a similar effect to recessing of the laminate of passivation layers from the opposite direction. Consequently, both are not required.

As will be appreciated, the passivation layer, or the laminate of passivation layers, in any of the described arrangements may be formed by deposition of one or more passivation layers over the plurality of electrical elements with an intermediate or end step to pattern at least the innermost, preferably all, deposited passivation layers, for instance by etching or lithography, to provide the discontinuity/discontinuous region. Patterning as described above may, alternatively, be achieved through the use of deposition of the passivation layer, or at least the innermost passivation layer of a laminate, over a mask or the like.

A passivation layer, or laminate of passivation layers, may be deposited on the one or more electrical elements initially as (a) continuous layer(s) by any suitable deposition method, for example atomic layer deposition (ALD), molecular layer deposition (MLD), chemical vapour deposition (CVD), plasma enhanced chemical vapour deposition (PE-CVD), physical vapour deposition (PVD), sputtering and the like. Suitable materials for the passivation layer, include but are not limited to, metal oxides, metal nitrides and metal carbides as well as allotropes of carbon, such as diamond-like-carbon (DLC). In some embodiments the passivation layer or laminate of passivation layers may comprise silica ($SiO_2$), silicon nitride ($Si_3N_4$), alumina ($Al_2O_3$), zirconia ($ZrO_2$), magnesia (MgO), tantala ($Ta_2O_5$), hafnia ($HfO_2$), silicon-tantalum oxide ($SiTaO_x$) or the like and combinations thereof. Preferably, the material and method chosen for the deposition should not create a reducing environment that can cause an increase in oxygen vacancies in the ceramic member, otherwise a high temperature recovery step in oxidising atmosphere may be required. Alumina is a particularly preferred material for use as the passivation layer, or the innermost layer of the laminate of passivation layers, since it has a very good adhesion to etched ceramic materials, particularly etched PZT. Silica, tantala, silicon-tantalum oxide ($SiTaO_x$) and hafnia are particularly suitable materials because of their high chemical inertness. Silica has also been shown to have good adhesion to etched ceramic materials, particularly etched PZT.

Where a laminate of passivation layers is employed, each layer may be composed of any one or more passivation materials as detailed above, and each layer may be deposited by the same or different techniques from one another. Thus, in some embodiments, the composition of at least one layer of a laminate of passivation layers is different from at least one other layer of the laminate. Preferably, the composition of the innermost layer of the laminate which is disposed adjacent to the one or more electrical elements differs from the composition of at least one other layer of the laminate, preferably all other layers of the laminate.

Preferably, in embodiments wherein the electrical component comprises a laminate of multiple passivation layers disposed adjacent to the ceramic member and first and second electrodes of each of the one or more electrical elements, and: a) the innermost layer of the laminate which is disposed adjacent the ceramic member and first and second electrodes comprises: i) alumina; ii) zirconia and/or hafnia; or iii) silica, tantala, and/or silicon-tantalum oxide; and/or b) at least one of the other layers of the laminate which is not the innermost layer comprises silica and/or silicon nitride. In particularly preferred embodiments, the innermost layer of the laminate comprises alumina and at least one, preferably all, remaining layers of the laminate comprise silica.

The total thickness of the passivation layer, or laminate of passivation layers, is not particularly limited, so long as adequate electrical passivation between the first and second electrodes is achieved. Nevertheless, a particular advantage of the present invention is that the discontinuous, and optionally recessed, nature of the passivation layer(s) can be arranged such that the thickness of the passivation layer does not inhibit the piezoelectric/electrostrictive properties of the ceramic member of the electrical element, as discussed below. Thus, the present invention allows for the selection of passivation layering with total thickness which may be optimal for passivation (increasing thickness can for instance reduce defects), yet which might normally be considered inhibitive of piezoelectric/electrostrictive performance of the ceramic member (i.e. by inhibiting displacement of the electrical element).

Suitably, the total thickness of the passivation layer, or laminate of passivation layers, is lower than 750 nm, the thickness depending on the specific material, or combination of materials, and on the deposition method or methods employed. The minimum thickness is not particularly limited as long as continuous layers may be achieved initially, before patterning to create discontinuity or a recess, and adequate passivation of the first and second electrodes is achievable together with adequate protection of the piezoelectric member. Total thickness of the passivation (either as a single passivation layer or laminate of passivation layers) may thus be from 20 nm to 700 nm, preferably from 50 nm to 650 nm, more preferably from 100 to 600 nm. Where a laminate of passivation layers is used, the thickness of each passivation layer may suitably be from 5 to 500 nm, for example from 50 to 500 nm, from 100 to 450, or from 200 to 400 nm. As will be appreciated, when more than one passivation layer is present, each layer may be of a different thickness to another.

The passivation layer, or the innermost layer of the laminate of passivation layers, is deposited adjacent to the one or more electrical elements. The passivation layer, or the laminate of multiple passivation layers, electrically insulates the first and second electrodes from each other so that possible paths for shorts are no longer available. In other particularly preferred embodiments, especially where the passivation layer includes recessing, with or without any discontinuity, the innermost layer of the layer laminate comprises hafnia and at least one, preferably all, remaining layers of the laminate comprise silica.

The passivation layer, or laminate of passivation layers, may isolate the electrical traces that provide connection to the drive circuitry to one of the first and second electrodes from the other of the first and second electrodes. Additionally the passivation layer or laminate of passivation layers may protect the electrical traces from the external environment.

In embodiments where the ceramic member and first and second electrodes are arranged in a stack of layers in a thickness direction as described hereinbefore, and each layer has lateral surfaces extending in a thickness direction, the passivation layer, or laminate of multiple passivation layers, at least partially overlies the second electrode (which is disposed on the opposite side of the ceramic member to that which faces the substrate) and is disposed adjacent to the lateral surfaces of the ceramic member and those of the first and second electrodes. Preferably the passivation layer, or laminate of multiple passivation layers, overlies the second electrode to the extent that the trace connected to the second electrode is reliably passivated.

As discussed hereinbefore, a particular advantage of the passivation in the present invention is that by having isolated regions of passivation layer(s) each associated with a single electrical element, it avoids cascading failure mechanisms which can lead to complete device failure as a result of failure of only a single electrical element. This is because the discontinuous passivation layer, or at least the innermost layer of a laminate of passivation layers, may be susceptible to chemical attack, or can be the most susceptible component to chemical attack, for example from the external environment. By having discontinuity in the intermediate regions between neighbouring electrical elements, propagation of chemical attack affecting multiple electrical elements can be reduced or prevented, avoiding complete device failure. The existence of isolated failed electrical elements can be compensated for (e.g. by adjusting waveform to adjacent functional electrical elements) to extend device lifetime.

The effect of the discontinuity is particularly useful where at least the innermost passivation layer has a composition that is particularly susceptible to chemical attack. For example, at least an innermost alumina passivation layer is particularly useful as a passivation layer for its ability to protect ceramic materials, particular etch-damaged PZT, yet alumina is particularly susceptible to chemical attack in certain environments. Thus, the present invention can be particularly beneficial for deriving the benefits from the use of alumina as a passivation layer material, whilst avoiding the detrimental impact on device lifetime it can otherwise exacerbate.

Additional discontinuity provided in a region overlying an electrical element, for example in the form of a window, or where a laminate of passivation layers is recessed above each of the plurality of electrical elements, the negative impact of the passivation layer or laminate of multiple passivation layers on the displacement of the electrical element during operation is mitigated.

Each of the one or more discontinuity regions discussed above may be provided, for example, by etching, in a single step or in separate steps.

The electrodes of at least one of the one or more electrical elements are connected to drive circuitry through electrical traces. The electrical traces may be deposited on the passivation layer, or on one of the passivation layers of the laminate of multiple passivation layers, and they are connected to the electrodes, for instance, through vias formed in the passivation layer or layers. The vias can be differentiated from a discontinuity or recess as described herein because the vias are filled with an electrically conductive element or elements, whilst the discontinuities and recesses are not.

The electrical traces may be deposited by sputtering or by any other suitable method known in the art. The electrical traces are preferably metal traces for example comprising gold (Au), aluminium (Al), copper (Cu), platinum (Pt) or the like and combination thereof. Thin adhesion layers may also be deposited prior to or after the formation of the electrical traces.

In some embodiments, the traces are themselves overlaid by at least one passivation layer of the laminate of multiple passivation layers so that the traces are at least partially interposed between layers of a laminate of multiple passivation layers and to the extent that the region of the traces that is to be connected to the drive circuitry is exposed.

In preferred embodiments, the electrical traces at least partially interpose two adjacent passivation layers of the laminate of multiple passivation layers, wherein the two adjacent passivation layers do not include the innermost passivation layer. In other preferred embodiments, the innermost layer of the laminate of passivation layers comprises alumina, zirconia, silica, tantala, silicon-tantalum oxide ($SiTaO_x$) and/or hafnia, most preferably alumina, and the two adjacent passivation layers between which the electrical traces are interposed do not comprise alumina, preferably wherein the two layers each comprises silica, zirconia, silicon nitride and/or hafnia, most preferably silica.

The electrical component of the invention may further comprise a continuous insulating layer, or laminate of insulating layers, arranged to overlie each of the one or more electrical elements arranged on the first side of the substrate layer. As will be appreciated, the insulating layer acts as a barrier to isolate the electrical elements from the external environment and helps protect the electrical elements from chemical attack (e.g. from moisture or ink depending on the particular application of the electrical component). The provision of improved protection of the electrical component from the external environment and, in particular, protection from chemical attack may provide additional benefits. The continuous insulating layer, or laminate of insulating layers, may also allow the advantages of a discontinuous passivation layer, or laminate or passivation layers, to be enjoyed without loss of protection from the external environment. As discussed hereinbefore, there are advantages to having discontinuous regions in the passivation layer, including for instance in the intermediate region between adjacent electrical elements. Such a discontinuous region reduces the susceptibility of the electrical component to a cascading failure by reducing the likelihood of cascading failure where corrosion spreads from one failed electrical element to another. Furthermore a discontinuity in the form of a window may be provided in the passivation layer, or laminate of passivation layers, in a region overlying each of the one or more electrical elements, or the passivation layer or laminate of passivation layers may be recessed in a region overlying each of the plurality of electrical elements. This is used as a means for preventing or reducing inhibition of the displacement of the one or more electrical elements, so as to maximise piezoelectric/electrostrictive performance. The presence of a continuous insulating layer overlying the electrical component simultaneously protects the electrical elements from the external environment but can also plug defects, such as micro-cracks or pinholes, in the underlying passivation layer, and may also overlie discontinuous or recessed regions of the passivation layer, or laminate of passivation layers, such as in the case where a discontinuity is provided in an intermediate region between neighbouring electrical elements or where a discontinuity is provided in the passivation layer or laminate of passivation layers in a region above each of the one or more electrical elements.

The term "laminate of insulating layers" is intended to refer to a plurality of overlaid insulating layers which are stacked in a thickness direction, wherein adjacent insulating layers are differentiated from each other either based on having different compositions, for example to the extent that each layer comprises a different major component (e.g. where major means above 50 vol. %), and/or by the presence of at least partially interposing intermediate layers which physically separate insulating layers, which insulating layers may or may not be of substantially the same composition.

As will be appreciated, the thickness of individual insulating layers, including at least partially interposing intermediate layers, may vary in the direction substantially perpendicular to the thickness direction across the electrical component. It will also be appreciated that individual layers of the laminate of passivation layers may themselves be formed from several overlaid sub-layers resulting, for instance, from multiple rounds of a deposition process. Such sub-layers are not, however, distinguished on the basis of composition, as described for the laminate discussed above, and are not separated by any interposing layers, so as to be considered distinct layers in a laminate. Similarly, where only a single insulating layer is provided instead of laminate of multiple passivation layers, the single insulating layer may also comprise several sub-layers resulting, for instance, from multiple rounds of a deposition process, as described above.

The term "continuous" used herein in connection with the insulating layer, or laminate of insulating layers, is intended to refer to an insulating layer, or laminate of insulating layers, which extends continuously, without disruption, to fully overlie the one or more electrical elements, and corresponding passivation layers(s) associated therewith, that are arranged over the substrate. Where there is a plurality of electrical elements, it will be appreciated that the insulating layer also extends over underlying intermediate regions between electrical elements. Thus, the continuous layer typically overlies substantially all of the side of the substrate upon which the electrical elements are arranged.

The insulating layer or laminate of layers may be deposited on each of the one or more electrical elements by any method of deposition known in the art. Preferably the insulating layer or laminate of layers will be deposited by a different method to the method used to deposit the outermost passivation layer. This would reduce the possibility that point defects present in the passivation layer will be reproduced and extended through the insulating layer or laminate of layers. Preferably the insulating layer or laminate of insulating layers are deposited by atomic layer deposition (ALD), molecular layer deposition (MLD), sputtering and the like. Suitable materials for the insulation layer have a very high chemical inertness. Example of suitable materials include but are not limited to silica ($SiO_2$), zirconia ($ZrO_2$), tantala ($Ta_2O_5$), hafnia ($HfO_2$) or the like and combinations thereof. Where a laminate of insulating layers is employed, each layer may be composed of any one or more insulation materials as detailed above, and each layer may be deposited by the same or different techniques from one another.

The insulating layer, or laminate of insulating layers, preferably include one or more layers of silica, hafnia, zirconia, tantala, and combinations thereof. In some embodiments the insulating layer, or laminate of insulating layers, includes one or more layers of silica and/or tantala, zirconia and hafnia. In other embodiments the insulating layer is a laminate of insulating layers including a plurality of silica layers and one or more layers of tantala, zirconia or hafnia, or a plurality of tantala layers and/or one or more layers of zirconia or hafnia.

In preferred embodiments the laminate of insulating layers includes a plurality of silica layers, wherein a silica layer is arranged so as to be adjacent to the electrical element/passivation layer and wherein the laminate further comprises a plurality of tantala layers, preferably wherein the silica and tantala layers are arranged in a generally alternate manner over the thickness of the laminate.

The thickness of the insulating layer, or laminate of insulating layers, is not particularly limited although thinner layers are generally preferred to reduce any possible inhibition of the displacement of the electrical element during operation. Generally the thickness of the insulating layer or laminate of insulating layers is suitably in the range of from 10 nm to 50 nm, preferably from 12 to 30 nm, more preferably from 15 to 25 nm. Different thickness values might be required according to the nature of the insulating material and the deposition technique.

The insulating layer or laminate of insulating layers is preferably made of a chemically robust material for example hafnia, tantala, zirconia and silica alone or in combination and is preferably deposited by atomic layer deposition (ALD). The combination of silica and tantala layers has been found by the inventors to be particularly effective in providing protection from the external environment, particularly from an aqueous environment, for example when the electrical component is being used in a droplet ejection head with aqueous inks or where aqueous contaminants are present.

The insulating layer or laminate of insulating layers may fully cover each electrical element of the electrical component, especially any discontinuity in the passivation layer or laminate of passivation layers. Moreover, the insulating layer provides means for mending (e.g. filling/plugging) defects in the underlying passivation layer or the outermost of the layers of the laminate of passivation layers, such as micro-cracks or pinholes, preferentially ALD techniques are used in order to realise this effect. The presence of the insulating layer may also confer a more uniform topography to the electrical component so that the bonding to a capping layer in MEMS applications may be more effective and less prone to defects such as voids or the like that are exacerbated by increased topography.

As discussed above, when present, the insulating layer or laminate of insulating layers typically overlies substantially all of the surface of the electrical component which includes the one or more electrical elements. It will nevertheless be appreciated that the insulating layer or laminate of insulating layers may be removed from those areas on the electrical component where electrical connections with the driving circuitry have to be established. Such areas do not overlie any of the electrical elements provided on the electrical component.

The insulating layer or laminate of insulating layers may protect the electrical elements from the external environment and from contact with chemicals so that the manufacturing process of the electrical component including one or more electrical elements may reach higher yields and the lifetime of the electrical component may be extended. The combination of the continuous insulating layer and the discontinuous passivation layer may be advantageous in extending the usable lifetime of the electrical component.

In a second aspect, each of the one or more electrical elements may, instead of or as well as the discontinuous passivation layer, be provided with a discontinuous intermediate layer, disposed adjacent the electrical element and at least partially underlying each of the one or more electrical elements, where the discontinuity is over an intermediate region between neighbouring electrical elements. The intermediate layer may act so as to enhance the adhesion of the lower first electrode to the lower layers membrane and/or to act as an ion diffusion barrier, such as for lead barrier layer preventing diffusion of lead ions out of a lead-based ceramic material, such as the PZT, and into the substrate/base layer. In other embodiments, both a discontinuous passivation layer, or laminate of passivation layers, and a discontinuous intermediate layer are provided, where the discontinuity in the passivation layer, or at least the innermost layer of a laminate of passivation layers, at least partially overlies the discontinuity in the underlying intermediate layer over the intermediate region between neighbouring electrical elements and instead of or in addition to the discontinuity in the passivation layer the intermediate layer may be discontinuous in at least one intermediate region between neighbouring electrical elements of the electrical component. In preferred embodiments the discontinuous intermediate layer is discontinuous over the majority, preferably all, of the intermediate regions between neighbouring electrical elements. In further preferred embodiments the intermediate layer is segmented into isolated regions, wherein each electrical element of the plurality of electrical elements has an isolated region of the segmented intermediate layer at least partially underlying it.

In a third aspect, an actuator component for use in a droplet ejection apparatus, wherein the actuator component is the electrical component according to the first aspect, is provided.

In a fourth aspect, a microelectromechanical system including an electrical component according to the first, second or third aspect and a capping layer attached to the insulated electrical component. The capping layer may define a single cavity for groups of, or all of the electrical elements, or may define a respective cavity for each electrical element. Such cavities may be sealed in a fluid-tight manner. The capping layer may be composed of any material common in the art and may be attached to the electrical component in any suitable way known in the art. The capping layer may be formed of silicon (Si), and may for example be manufactured from a silicon wafer, whilst the features provided in the capping layer, including the cavities may be formed using any suitable fabrication process, e.g. an etching process, such as DRIE or chemical etching. In some cases, at least a subset of features of the capping layer may be formed from an additive process, such as a CVD technique (e.g. PECVD), or ALD. In still other cases, the features may be formed using a combination of etching and/or additive processes. The capping layer may be bonded to the electrical component through the insulating layer or the laminate of insulating layers.

The presence of the insulating layer may help improving the topography of the electrical component so that the bonding to the capping layer may be more effective and less prone to defects such as voids or the like.

In some embodiments the microelectromechanical device may further include a nozzle plate attached to the insulated electrical component and arranged to be at the opposing side of the electrical component to the capping layer.

In a fifth aspect, a droplet ejection head comprising the electrical component or a MEMS device as described above is provided.

In a sixth aspect, a droplet ejection apparatus comprising a droplet ejection head according to the fifth aspect is provided.

Droplet deposition apparatuses have widespread usage in both traditional printing applications, such as inkjet printing, as well as in 3D printing and other materials deposition or rapid prototyping techniques.

An actuator component suitable for use in a droplet deposition apparatus may, for instance, comprise a plurality of fluid chambers, which may be arranged in one or more rows, each chamber being provided with a respective actuator element and a nozzle. As will be appreciated, in this aspect the actuating element corresponds to the electrical element described hereinbefore and is actuable to cause the ejection of fluid from a chamber of the plurality through a corresponding one of the nozzles.

The actuating element may, for example, function by deforming a wall bounding one of the fluid chambers of the actuator component. Such deformation may in turn increase the pressure of the fluid within the chamber and thereby cause the ejection of droplets of fluid from the nozzle. Such a wall may be in the form of a membrane layer which may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), hafnia ($HfO_2$), tantala ($Ta_2O_5$), zirconia ($ZrO_2$), titanium oxide ($TiO_2$), silicon (Si) or silicon carbide (SiC).

The droplet deposition apparatus typically comprises a droplet ejection head comprising the actuator component and one or more manifold components that are attached to the actuator component. Such droplet ejection heads may, in addition, or instead, include drive circuitry that is electrically connected to the actuating elements, for example by means of electrical traces provided by the actuator component. Such drive circuitry may supply drive voltage signals to the actuating elements that cause the ejection of droplets from a selected group of fluid chambers, with the selected group changing with changes in input data received by the head.

To meet the material needs of diverse applications, a wide variety of alternative fluids may be deposited by droplet ejection heads as described herein. For instance, a droplet ejection head may eject droplets of ink that may travel to a sheet of paper or card, or to other receiving media, such as textile or foil or shaped articles (e.g. cans, bottles etc.), to form an image, as is the case in inkjet printing applications, where the droplet ejection head may be an inkjet printhead or, more particularly, a drop-on-demand inkjet printhead.

Alternatively, droplets of fluid may be used to build structures, for example electrically active fluids may be deposited onto receiving media such as a circuit board so as to enable prototyping of electrical devices. In another example, polymer containing fluids or molten polymer may be deposited in successive layers so as to produce a prototype model of an object (as in 3D printing). In still other applications, droplet ejection heads might be adapted to deposit droplets of solution containing biological or chemical material onto a receiving medium such as a microarray.

Droplet ejection heads suitable for such alternative fluids may be generally similar in construction to printheads, with some adaptations made to handle the specific fluid in question. Droplet ejection heads which may be employed include drop-on-demand droplet ejection heads. In such heads, the pattern of droplets ejected varies in dependence upon the input data provided to the head.

DETAILED DESCRIPTION OF THE DRAWINGS

The invention will now be described with reference to the drawings, which are intended to be illustrative of the invention and in no way limiting and which are representational only and not to scale, for the sake of clarity. Throughout the following description like reference numerals are used where appropriate.

Figure 3:
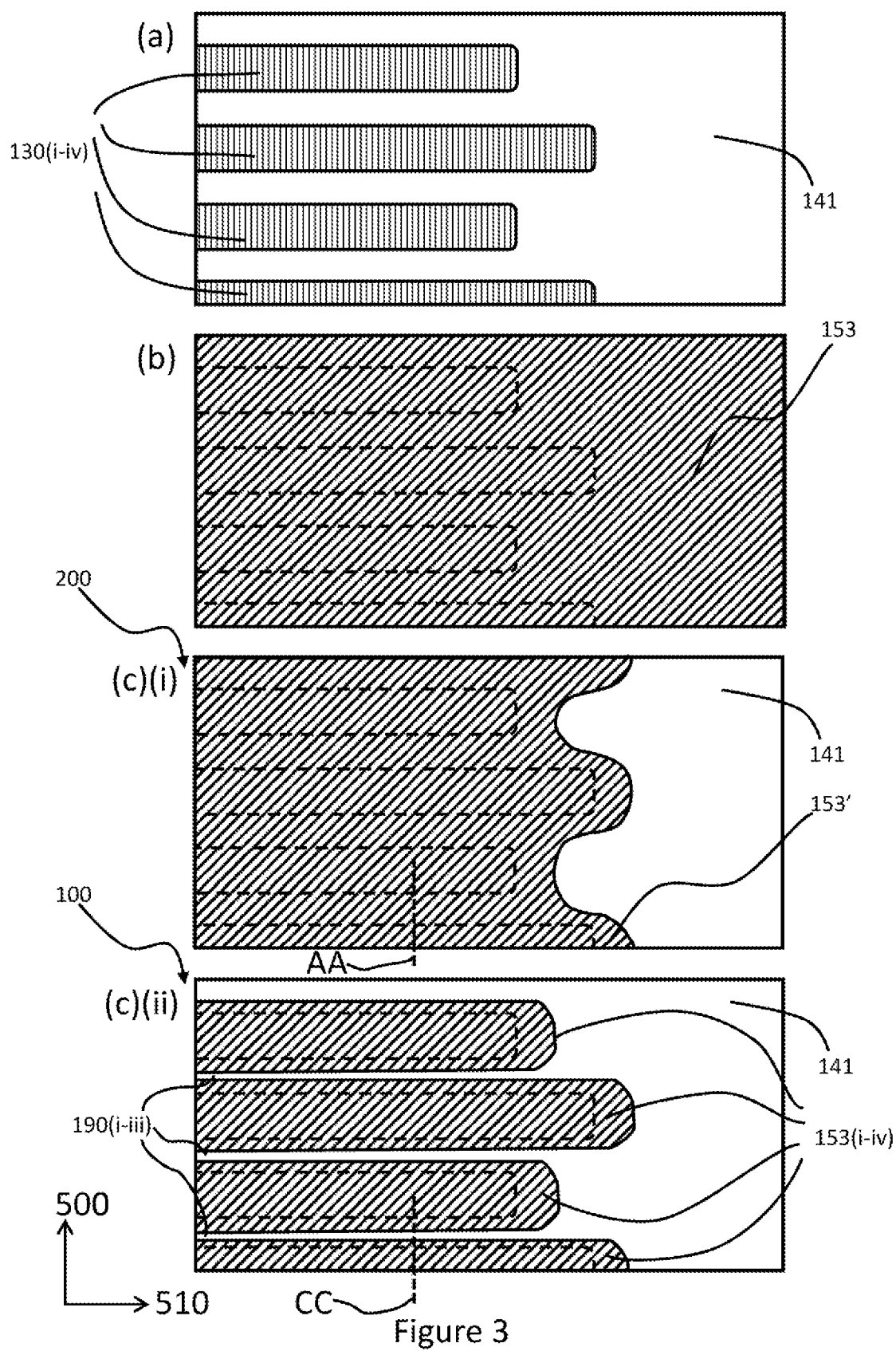
FIG. 3(a-b) depicts a top view of a portion of an electrical component at two steps during manufacture.
Figure 4:
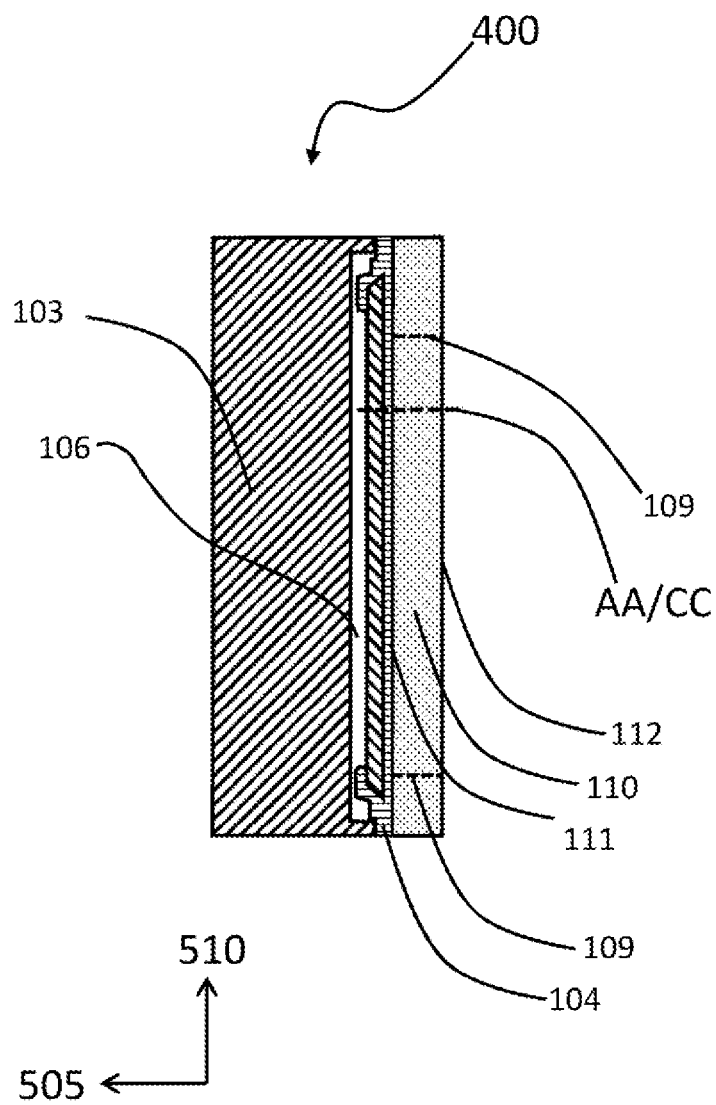
FIG. 4 is a schematic diagram of a cross-section through an electrical component showing a general layout for an electrical element.

FIG. 1(a) is a schematic diagram of a cross-section through part of an electrical component 100 according to an embodiment of the disclosure where the cross-section location CC is indicated in FIG. 3(c)(ii) and also in FIG. 4. FIG. 1 shows portions of two adjacent electrical elements 120(i) and 120(ii) within the electrical component 100, where the component 100 comprises a plurality of electrical elements 120 (which may be arranged in a row or in an array of rows on or overlying the substrate layer 110).

In the embodiment shown in FIG. 1(a), the electrical component 100 for a microelectromechanical systems device comprises a plurality of electrical elements 120 where each electrical element comprises a ceramic member 123, a first electrode 121 and a second electrode 122 where these components of each electrical element 120 are arranged in a stack of layers. The stack of layers each have lateral surfaces extending in a thickness direction 505, wherein the ceramic member 123 has a first side 127 and an opposing second side 128 spaced apart in a thickness direction 505. The first side 127 of the ceramic member faces the substrate layer 110 and a first side 111 of the substrate layer 110 and the first electrode 121 is disposed adjacent the first side 127 of the ceramic member 123 so as to interpose the substrate layer 110 and the ceramic member 123. The second electrode 122 is disposed adjacent to the second side 128 of the ceramic member 123; and the passivation layer 150, or laminate of multiple passivation layers 150, at least partially overlies the second electrode 122 and is disposed adjacent to the lateral surfaces of the ceramic member 123 and those of the first and second electrodes 121 and 122 respectively of each electrical element 120.

As seen in FIG. 1(a), the electrical elements 120 are arranged over the first side 111 of the substrate layer 110, where each electrical element 120 is separated from a neighbouring electrical element 120 by an intermediate region 125 in the width direction 500. It will be understood by the skilled person that an electrical component 100 may contain a plurality of electrical elements 120(i to n) all separated by a plurality of intermediate regions 125(i to n−1).

The electrodes 121, 122 are disposed adjacent the ceramic member 123 such that a potential difference may be established between the first electrode 121 and second electrode 122 and through the ceramic member 123 during operation. There is a passivation layer 150, which in the example shown in FIG. 1(a) is a laminate of multiple passivation layers 151, 152 and 153, though it may be understood that in other embodiments it may be a single layer. The passivation layer 150 at least partially overlies each of the plurality of electrical elements 120 so as to provide electrical passivation between the first electrode 121 and the second electrode 122 of each of the plurality of electrical elements 120. The innermost passivation layer 153 of the laminate of passivation layers 150, which is disposed adjacent the underlying electrical element 120, has a discontinuous region 190 in the width direction 500, which overlies the intermediate region 125 between neighbouring electrical elements 120(i) and 120(ii) of the electrical component 100. It may be understood that in other embodiments, all layers 151-153 of the laminate of passivation layers 150, may each have a coincident discontinuous region 190, over at least one intermediate region 125 between neighbouring electrical elements 120. FIG. 1(a) also illustrates another aspect of the disclosure, where the electrical component comprises a laminate of intermediate layers 140 which is disposed adjacent to the first side 111 of the substrate layer 110. The laminate of intermediate layers 140 is located between the substrate layer 110 and the electrical element 120. The laminate of intermediate layers 140 comprises a continuous layer 141 and a discontinuous intermediate layer 142. The intermediate layer 142 is at least partially interposed between the electrical element 120 and the substrate layer 110, where the intermediate layer 142 lies above the first side 111 of the substrate layer 110 in the thickness direction 505; wherein the intermediate layer 142 has a discontinuous region 191 over at least one intermediate region 125 between neighbouring electrical elements 120(i) and 120(ii) of the electrical component 100.

It will be understood that, depending on the circumstances or particular design or use of materials for an electrical component 100, only one or the other of discontinuous regions 190 and 191 (associated with the innermost passivation layer 153 and the intermediate layer 142, respectively) may be present in a particular embodiment. Depending on the respective designs and compositions of the passivation layer 150 and the intermediate layer 142; in other embodiments both the discontinuous regions 190 and 191 may be present. It may be understood that the creation of discontinuous regions depends on the materials used in the various layers of the electrical component 100, their vulnerability to chemical attack, and the likelihood that chemical attack will occur (for example whether there are routes which enable undesirable chemicals to reach the more vulnerable layers, such routes might, for example, be unavoidable micro-flaws, cracks and pinholes in overlying layers). Alternatively, such routes might be because various layers have to be exposed during the masking and etching process to create the electrical component 100.

As shown in FIG. 1(a) the discontinuous region 191 may be broader than the discontinuous region 190 in the width direction 500, however this is by no means essential, depending on the design and on the manufacture process it may be understood that in some embodiments the discontinuous regions 190 and 191 may be of similar or equal breadths in the width direction 500 and may or may not be manufactured at the same time. In the present embodiment depicted in FIG. 1(a) the discontinuous region 191 in the intermediate layer 142 is the same breadth in the width direction 500 as the intermediate region 125 as the two are formed at the same time, such that the intermediate layer 142 is discontinuous over all of the intermediate region 125, but this is by no means an essential feature and in other embodiments the intermediate layer 142 may be discontinuous over the majority, but not all, of the intermediate region 125 and may be formed at a different stage in the manufacture process.

In some embodiments the passivation layer 150, or at least the innermost first passivation layer 153 of the laminate of passivation layers 150, is discontinuous over the majority of the intermediate region 125 between neighbouring electrical elements 120, such that the discontinuous region 190 covers a majority of the intermediate region 125 in the width direction 500.

It will be understood that in some embodiments the electrical component 100 has a passivation layer 150, or at least the innermost first passivation layer 153 of the laminate of passivation layers 150, which includes a discontinuous region (e.g. in the form of one or more holes/apertures) overlying only a minority of the intermediate region 125 between neighbouring electrical elements 120.

It will be further understood that in some embodiments where the passivation layer 150 comprises a laminate of passivation layers 150, all layers of the laminate of passivation layers 150 may be discontinuous over the majority of the intermediate regions 125 between neighbouring electrical elements 120, such that the majority of the intermediate regions between neighbouring electrical elements 120 have areas where there are no overlying passivation layers. In other embodiments where the electrical component 100 comprises a laminate of multiple passivation layers 150 only the innermost first passivation layer 153 of the laminate of passivation layers 150 may be discontinuous over some or all of the intermediate regions 125 between neighbouring electrical elements 120, such that one or more other layers of the laminate overlie the intermediate regions 125 between electrical elements 120 where the innermost layer, first passivation layer 153, of the laminate does not. In other embodiments the laminate of multiple passivation layers 150 may comprise layers that are discontinuous in the width direction 500 to differing extents. In some embodiments, (see FIG. 1(b)) the innermost passivation layer 153 closest to the electrical element 120 in the thickness direction 505 may have the longest discontinuous region 190(i) that is the closest in length to the intermediate region 125 in the width direction 500.

In some embodiments the electrical component 100 comprises a passivation layer 150 that is a laminate of multiple passivation layers disposed adjacent to the ceramic member 123 and first and second electrodes 121, 122 of each electrical element 120, wherein the composition of the innermost passivation layer 153 of the laminate which is disposed adjacent to the ceramic member 123 and first and second electrodes 121, 122 differs from the composition of at least one other layer of the laminate, preferably all other layers (151, 152) of the laminate. Likewise the intermediate layer 142 may be composed of the same material as the innermost passivation layer 153 of the passivation layer 150 when that is a laminate of multiple passivation layers. For example, the innermost passivation layer 153, which is disposed adjacent the ceramic member 123 and first and second electrodes 121, 122, may comprise alumina. Additionally or instead, the intermediate layer 142 may comprise alumina. Furthermore at least one layer of the layers of the laminate, other than the innermost passivation layer 153, may comprise silica, zirconia, hafnia and/or silicon.

In some embodiments, the passivation layer 150 may include an additional discontinuity (i.e. in addition to that overlying the intermediate region 125). For example, the additional discontinuous region of the passivation layer 150 or laminate of passivation layers 150 may form a window 165 through to each underlying electrical element 120. Such a window 165 in the passivation layer 150 is advantageous for substantially reducing or avoiding any inhibitive effects of the passivation layer on the displacement of the electrical element during operation.

Figure 1B:
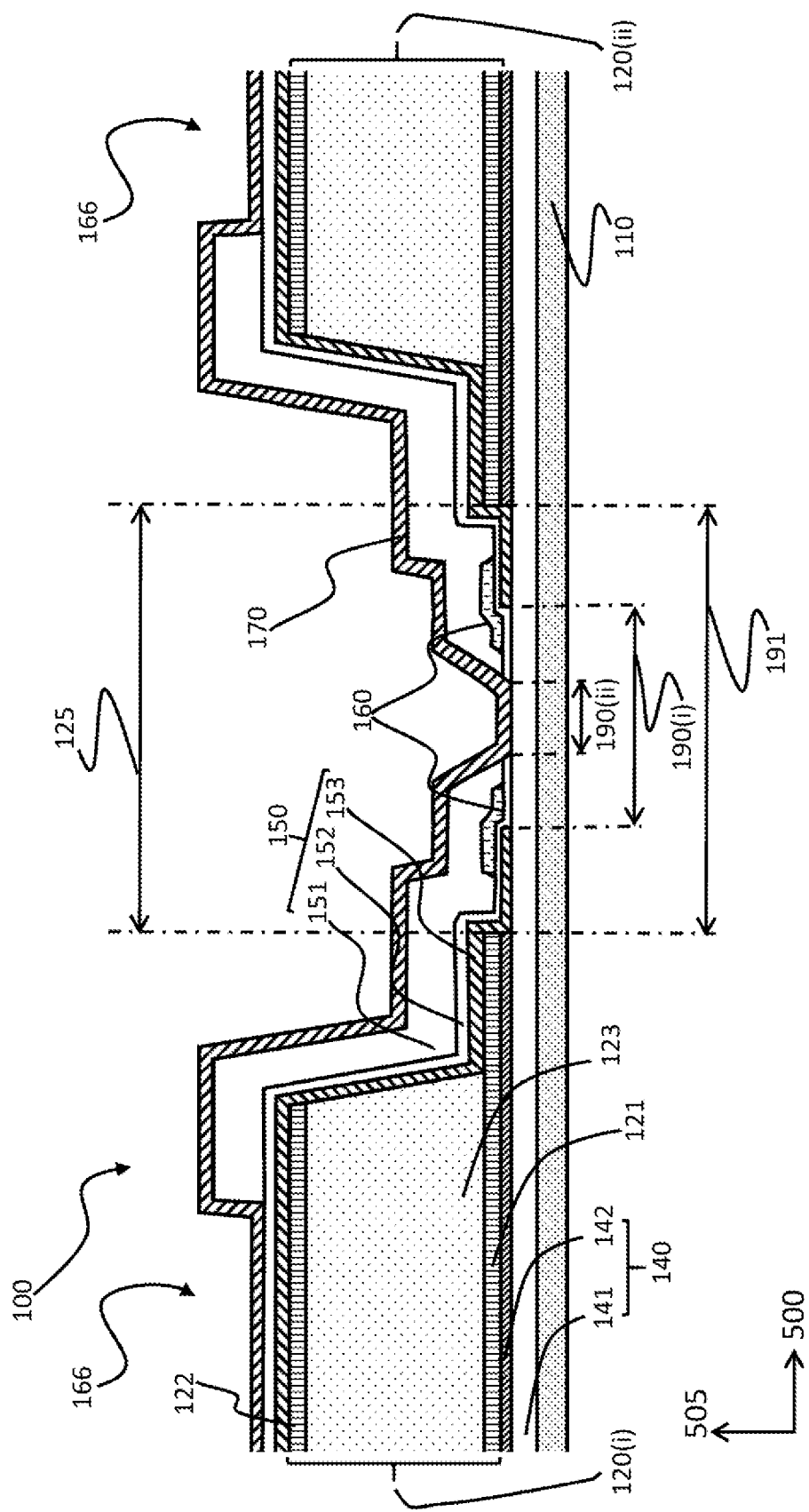
FIG. 1(b) is a schematic diagram of a cross-section through a portion of an electrical component according to another embodiment of the disclosure where there is a discontinuous region in all the layers of the laminate of passivation layers over an intermediate region, a discontinuous region in the intermediate layer underlying the first electrode and a recess over the electrical elements.

Considering now FIG. 1(b) it will be understood that in other embodiments the passivation layer 150 may include at least a removal of the outermost third or final passivation layer 151 of the laminate of passivation layers 150 so as to define a recess 166, where each individual recess 166 at least partially overlies an individual electrical element 120 of the plurality of electrical elements. In other words the passivation layer 150, or laminate of passivation layers 150 may be recessed at a side which faces away from each of the underlying electrical elements 120 in the thickness direction 505, wherein a recess 166 is provided in each region overlying each of the plurality of electrical elements 120, such that the passivation layer 150, or laminate of passivation layers 150, is thinner in a thickness direction 505 across the recesses 166 compared to other non-recessed regions of the passivation layer 150, or laminate of passivation layers 150. Such a recess 166 in the passivation layer 150 is advantageous for substantially reducing or avoiding any inhibitive effects of the passivation layer on the displacement of the electrical element during operation. It may be understood that the formation of such a recess 166 may require the use of suitable etches and etch stops such that one of the other layers of the laminate of passivation layers 150 acts as an etch stop (in the depicted instance passivation layer 152 may be a material suitable to act as an etch stop). In other embodiments suitable etch stop layers could be inserted at other points in the stack (e.g. in the thickness direction 505) so as to control the extent in the thickness direction of any such recess 166.

FIGS. 1(a) and 1(b) further show that the electrical component 100 comprises electrical traces 160 which connect the first and second electrodes 121 and 122 of at least one, preferably all electrical elements located at an end of the electrical component to drive circuitry (connections not visible). As shown, when a laminate of multiple passivation layers 150 is provided, the electrical traces may be at least partially interposed between layers of the laminate of multiple passivation layers 150. As seen in FIGS. 1(a) and 1(b), the electrical traces 160 at least partially interpose two adjacent passivation layers of the laminate, first passivation layer 151 and second passivation layer 152. In other embodiments, the electrical traces may interpose other passivation layers in a lamination of multiple passivation layers, but preferably the two adjacent passivation layers will not include the innermost passivation layer, third passivation layer 153. Furthermore the innermost third passivation layer 153 of the laminate may in preferred embodiments comprise alumina and the other layers 151 and 152, between which the electrical traces 160 are interposed, may not comprise alumina. The two layers 151 and 152 may each instead comprise silica zirconia, hafnia and/or silicon nitride.

Figure 1C:
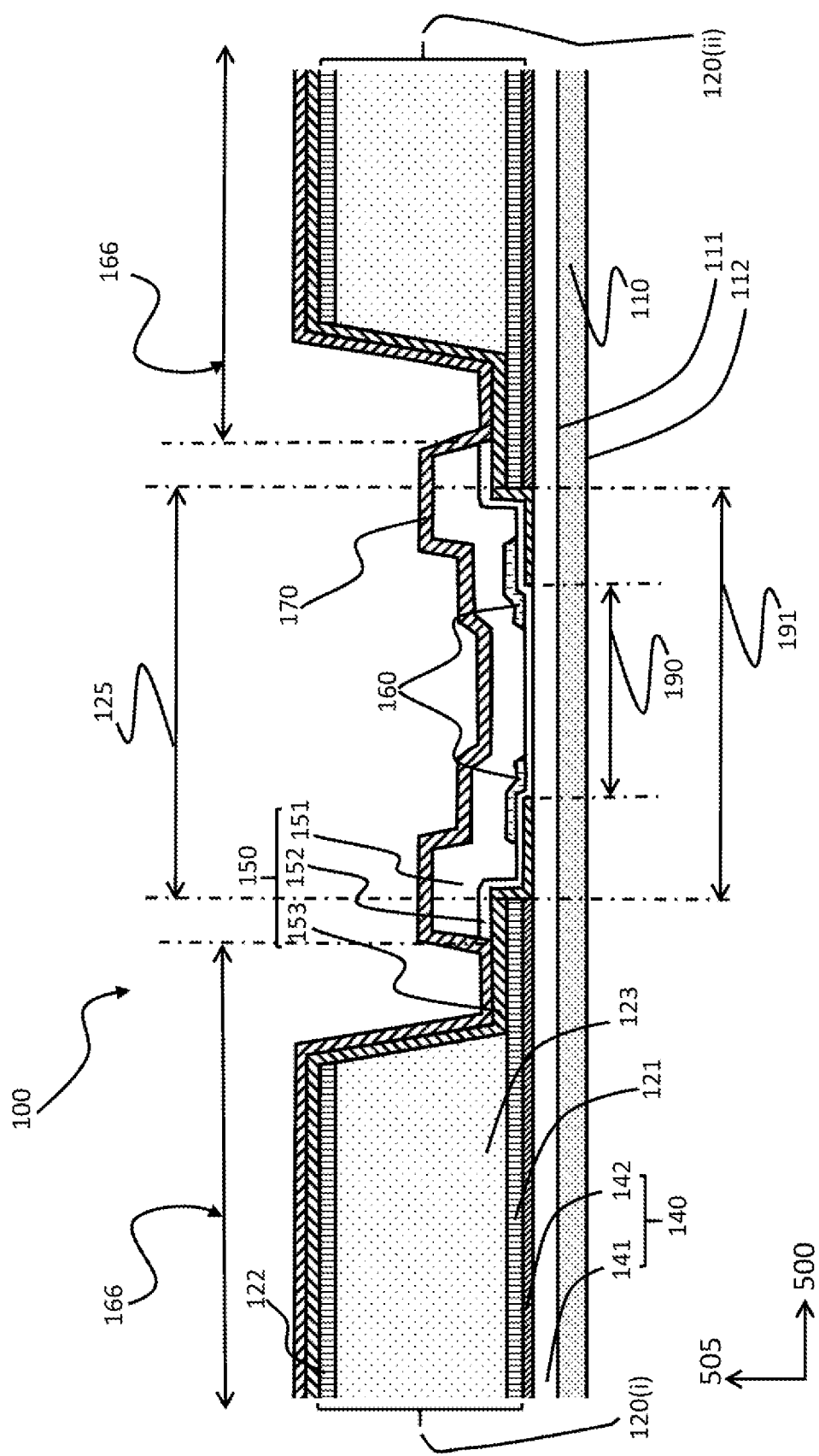
FIG. 1(c) is a schematic diagram of a cross-section through a portion of an electrical component according to another embodiment of the disclosure where there is a discontinuous region in the innermost layer of the laminate of passivation layers over an intermediate region, a discontinuous region in the intermediate layer underlying the first electrode and an alternative arrangement of a recess over the electrical elements to that seen in FIG. 1(b)

Turning now to FIG. 1(c), this depicts a schematic diagram of a cross-section through a portion of an electrical component according to another embodiment of the disclosure where there is a discontinuous region 190 in the innermost layer of the laminate passivation layer 150 and an alternative arrangement of a recess 166 over the electrical elements. Use of a suitably shaped mask and an etch step, as would be understood by one skilled in the art, may be used to remove all of the outermost passivation layer 151 and middle passivation layer 152 over the electrical element 120 at this particular cross-section whilst retaining these layers over the electrical traces 160. It may be understood that at other cross-sections, where the electrical traces 160 extend over the electrical element 120 so as to provide an electrical connection to the second electrode 122, the shape of the mask may be altered in this region so as to retain the outermost passivation layer 151 and middle passivation layer 152 over the electrical traces 160 and over the appropriate portion of the electrical element 120. In the embodiment depicted in FIG. 1(c) the innermost passivation layer 153 has been retained over the electrical element 120 so as to provide passivation between the first electrode 121 and the second electrode 122. The innermost passivation layer 153 has a discontinuous region 190 in the intermediate region 125.

Figure 2:
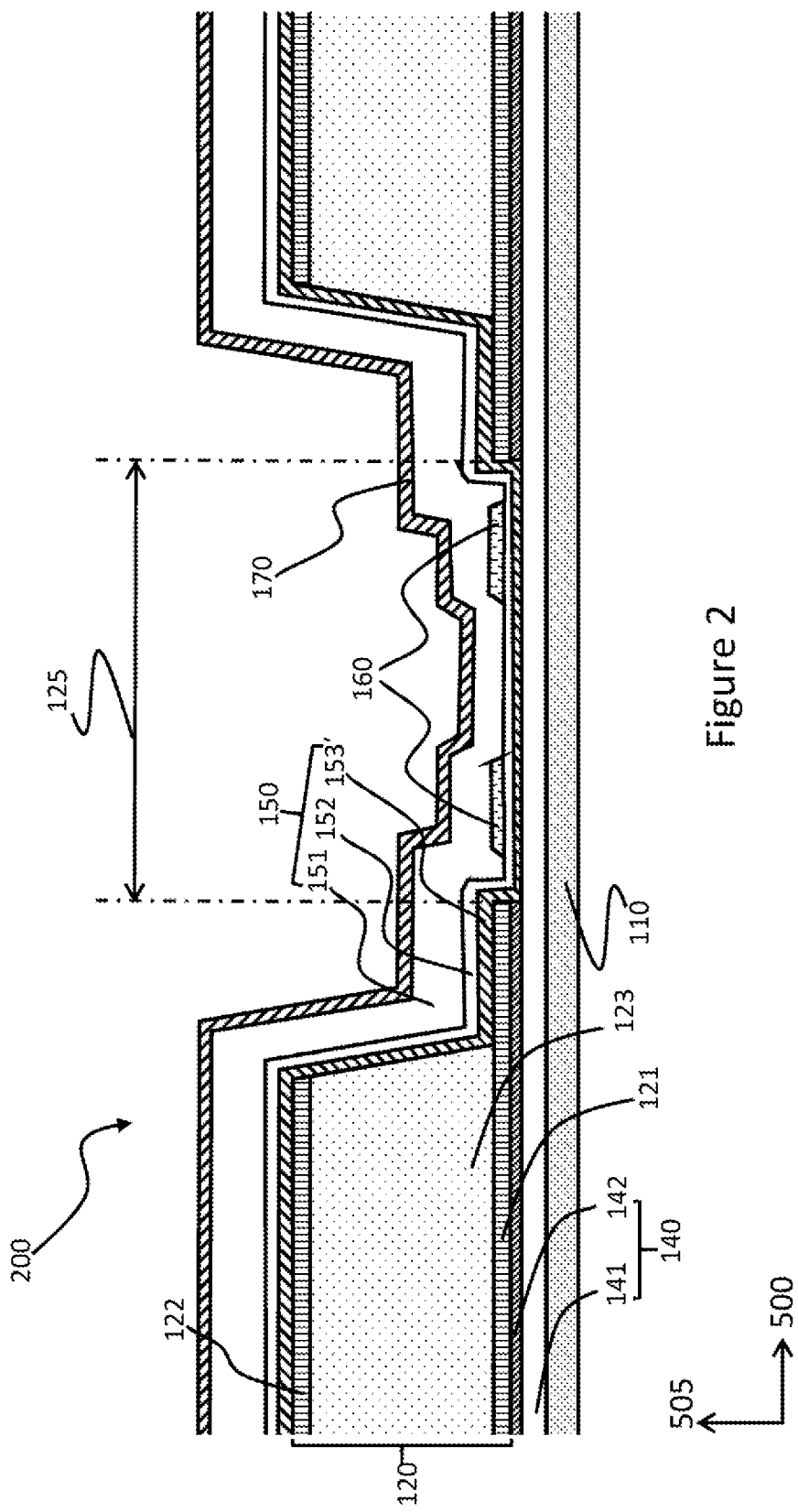
FIG. 2 is a schematic diagram of a cross-section through a portion of an electrical component according to a comparative test design where there is no discontinuous region between the electrical elements and no discontinuous region or recess over the electrical elements.

Considering now FIG. 2, this depicts a comparative test design 200 where the innermost passivation layer 153' is continuous overlying the intermediate region 125 between neighbouring electrical elements 120 and where, unlike the embodiment shown in FIG. 1(a) there is no additional discontinuity in the form of a window 165 in the passivation layer or, unlike the embodiments shown in FIGS. 1(b) and (c), recess 166 overlying the electrical elements 120. It will be understood that in comparison to the embodiments depicted in FIG. 1 this comparative test design 200 will be more susceptible to cascading failure if a corrosive failure occurs in part of continuous innermost passivation layer 153' as the corrosion will more readily be able to spread from an electrical element 120 to its neighbouring electrical element 120 via the continuous innermost passivation layer 153'. As shown in FIG. 1 (and also in FIG. 3(*c*)(ii)), the innermost passivation layer 153 is segmented into isolated regions (i.e. non-connected islands), each associated with a single underlying electrical element 120. This means that if one electrical element 120 in the array of electrical elements 120 is subject to damage that ultimately leads to failure, such failure is less likely to extend to its neighbouring electrical element 120 via the innermost passivation layer 153.

Providing discontinuous regions 190, 191 allows isolation of failed electrical elements to avoid cascading failures which are particularly prevalent where the composition of the passivation layer 150 (or the innermost layer of a laminate of multiple passivation layers 150) or the composition of an underlying intermediate layer 142 is/are more susceptible to moisture/chemical attack but where such a material is otherwise useful to use in the construction of the electrical component 100. For example alumina is such a material that is useful for the passivation layer 150 or for the innermost layer of a laminate of multiple passivation layers 150. Alumina is likewise useful for the composition of an underlying intermediate layer 142. If an individual electrical element 120 fails, then it can be compensated for (e.g. by adjusting waveform to adjacent functioning electrical elements 120) to extend the device lifetime.

Considering the comparative test design 200 in FIG. 2, it has a much thicker layer of material over the electrical element 120 in the thickness direction 505 than the embodiments depicted in FIG. 1. This may make the overall stack (electrical element 120 plus the passivation layer 150 and continuous insulating layer 170 above it in the thickness direction 505) stiffer than the corresponding stacks depicted in FIG. 1 and can have a negative effect on the deformation of components in comparative test design 200 under an imposed electrical field whilst the electrical elements 120 in FIGS. 1(*a*) and 1(*b*) will be part of a less stiff stack and hence be easier to deform for a given applied electrical field.

Turning now to FIG. 3(*a*) this shows a view looking down onto a portion of the electrical component 100 showing a number of stacks 130(*i-vi*) (where each stack 130 comprises the electrical element 120 on top of an uppermost discontinuous intermediate layer 142. The stacks 130 are situated on top of a lower lying continuous intermediate layer 141 (so that the in the view shown in FIG. 3(*a*) the top surface of the second electrode 122 can be seen). As may be seen, the stacks 130 are arranged in a row extending in the width direction 500 and staggered in the length direction 510, this is by no means an essential feature and in other designs there may be different arrangements of rows or arrays of stacks 130 with or without staggering or with different staggering patterns.

FIG. 3(*b*) shows the same view as in FIG. 3(*a*) after the deposition of the first passivation layer 153 and prior to any patterning thereof. Next, FIG. 3(*c*)(i) depicts a comparative test design 200 following the patterning stage in which the first passivation layer 153 has been patterned using a mask to give a serpentine shape at one end so as to remove excess material to provide a continuous first passivation layer 153'. FIG. 3(*c*)(ii) shows the result of the same patterning stage for producing an electrical component 100 of the present disclosure using a different mask to that in FIG. 3(*c*)(i), where the first passivation layer 153 has been patterned so as to create discrete portions, islands, or segments 153(*i-vi*) overlying the stacks 130(*i-vi*) with discontinuous regions 190(*i-iii*) located between the segments 153(*i-vi*) of the first passivation layer 153. It should be further noted that FIG. 3(*c*) indicates the location of two cross-sections AA and CC which are indicative of the locations of the cross-sections depicted in FIGS. 1 and 2.

Considering again FIG. 1(*a*) the passivation layer 150 is segmented into isolated regions or islands, wherein each electrical element 120 of the plurality of electrical elements has an isolated region of the segmented passivation layer 150 at least partially overlying it.

Turning now to FIG. 4, this is a schematic diagram of another cross-section through a microelectromechanical systems device 400 showing a general layout. FIG. 4 depicts a substrate layer 110 above which an electrical component 104 is located in the thickness direction 505. The electrical component 104 may for example be an electrical component 100 comprising multiple layers, as shown in FIG. 1(*a*) to (*c*). As may be seen from FIG. 4, in a microelectromechanical systems device 400, the electrical component 104 is elongate in cross-section such that its length in the length direction 510 is much greater than its thickness in the thickness direction 505. The direction out of the page is the width direction 500. The location of the cross-sections depicted in FIGS. 1 and 2 is indicated as cross-section AA/CC in FIG. 4. An example manufacture process for the electrical component 104 may be described in more detail in FIG. 6. Following manufacture of the electrical component 104 a capping layer 103 may be attached at numerous disparate locations to the electrical component 104 (attachment of the capping layer 103 is preferably to a continuous insulating layer 170—not shown in FIG. 4). FIG. 4 shows a capping layer 103 overlying and attached to the electrical component 104. The capping layer 103 may define a single cavity 106 for groups of, or all of the electrical elements 120, or the capping layer 103 is arranged to encapsulate individually each of the electrical elements 120 of the electrical component 104 so as to form a plurality of cavities 106 and to overlie the passivation layer 150 or laminate of passivation layers 150. Such cavities may be sealed in a fluid-tight manner. Preferably, the electrical component 104 is insulated with an insulating layer 170, or laminate of insulating layers 170, arranged over the electrical component 104 so as to interpose the electrical component 104 and the capping layer 103, preferably where the insulating layer 170, or laminate of insulating layers 170, is continuous and arranged so as to overlie substantially all of the substrate layer 110 in addition to each of the plurality of electrical elements 120 arranged thereon. Following the addition of the capping layer 103, the substrate layer 110 may be etched from the second side 112, for example to remove all the material of the substrate layer 110 between boundaries 109. With this removal it is possible to deform the intermediate layer 140, when in the form of a deformable membrane layer, when an electric field is applied to the actuating element 120.

Figure 5:
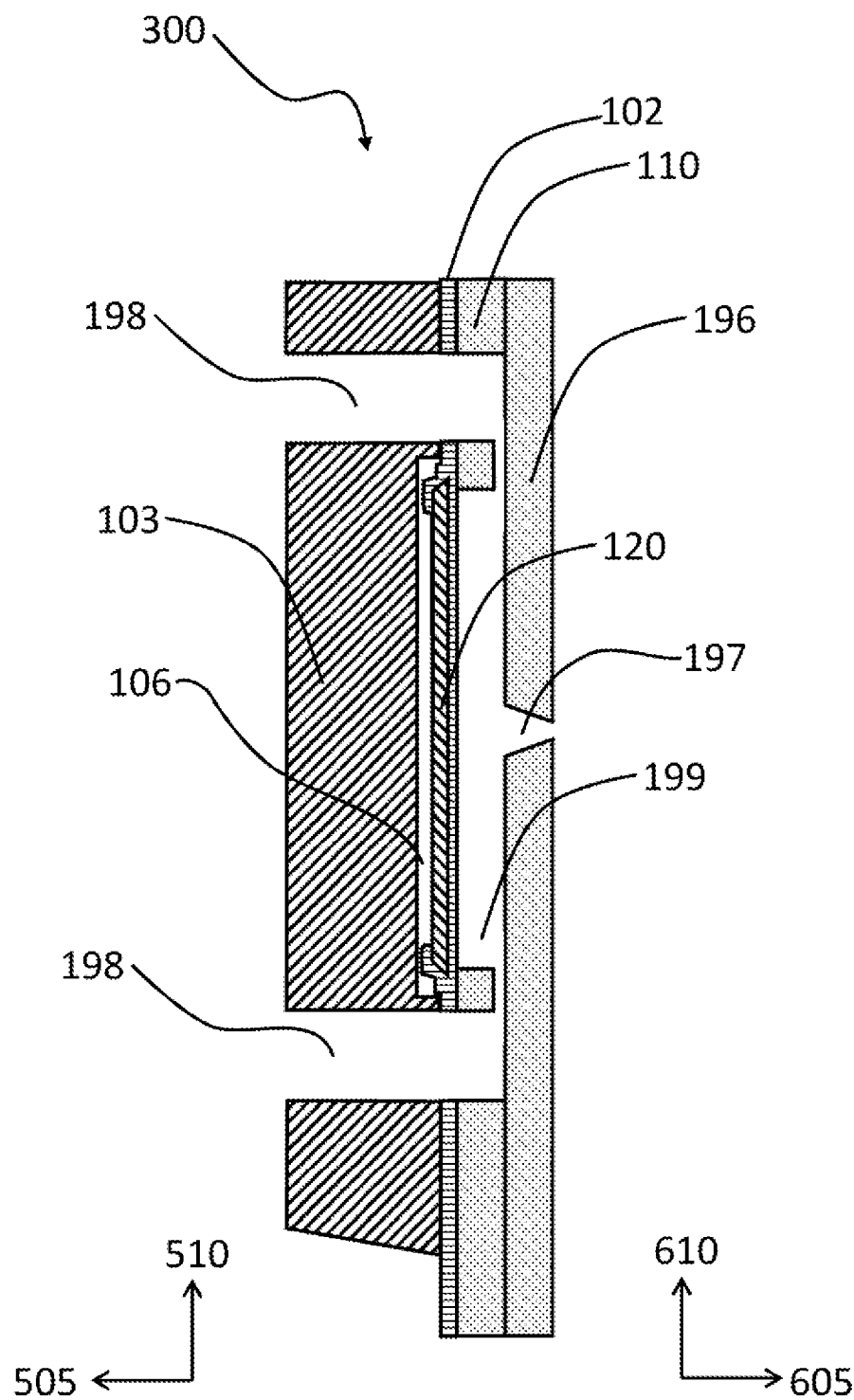
FIG. 5 is a schematic diagram of a cross-section through an electrical component showing a general layout for an electrical element for a droplet ejection head.

Considering now FIG. 5, this is a schematic diagram of a cross-section showing a general layout for a microelectromechanical systems device 300 for a droplet ejection apparatus, where the device 300 may comprise an actuator component 102 which comprises a plurality of electrical elements 120. The actuator component 102 may be similar to the electrical components 100 depicted in FIG. 1. In this particular embodiment the droplet ejection direction 605 is anti-parallel to the thickness direction 505. A fluid chamber 199 is located adjacent to the electrical element 120 so that in operation, when an electrical field is applied across the electrical element 120 it deflects so as to eject fluid through the nozzle 197 in the droplet ejection direction 605. Fluid, such as ink, may be supplied to the fluid chamber 199 via the fluid ports 198 which have been cut or etched through the capping layer 103. The capping layer 103 may define a single cavity 106 for groups of, or all of the electrical elements 120, or may define a respective cavity 106 for each electrical element 120. Such cavities may be sealed in a fluid-tight manner so as to prevent fluid within the fluid chambers 199 and fluid ports 198 from entering. The capping layer 103 may be formed of silicon (Si), and may for example be manufactured from a silicon wafer, whilst the features provided in the capping layer, including the cavities may be formed using any suitable fabrication process, e.g. an etching process, such as DRIE or chemical etching. In some cases, at least a subset of features of the capping layer may be formed from an additive process, such as a CVD technique (e.g. PECVD), or ALD. In still other cases, the features may be formed using a combination of etching and/or additive processes. The capping wafer may be bonded to the electrical component through the insulating layer or the laminate of insulating layers.

It will be understood that the fluid ports 198 may, for example, be slots supplying a multitude of fluid chambers 199, or they may comprise a plurality of small holes or slots each supplying an individual fluid chamber 199 or a small sub-group of fluid chambers 199. In some embodiments, only inlet fluid port(s) 198 may be required to supply fluid to the fluid chamber(s) 199. In other embodiments, the device 300 may operate in so-called through-flow mode, where fluid is supplied to the fluid chamber(s) 199 through a fluid port 198 located proximate to one end of the fluid chamber(s) 199 and fluid is removed from the fluid chamber(s) 199 via other fluid port(s) 198 located proximate to the other end of the fluid chamber(s) 199. In operation therefore fluid passes through each individual fluid chamber 199 with a proportion of the fluid being ejected via the nozzle 197 as a droplet when the electrical element 120 is actuated appropriately by supplying a suitable waveform. It will be understood that the plurality of electrical elements 120 will likewise be associated with a plurality of fluid chambers 199, nozzles 197 and fluid ports 198 as may be required and that one or more electrical elements 120 may be required per fluid chamber 199 and that individual fluid chambers 199 may have one or more nozzles 197 and fluid ports 198 as required. One or more electrical components may be used in a droplet ejection head, which may be used singly or with a plurality of other droplet ejection heads to form part of a droplet ejection apparatus.

Figure 6:
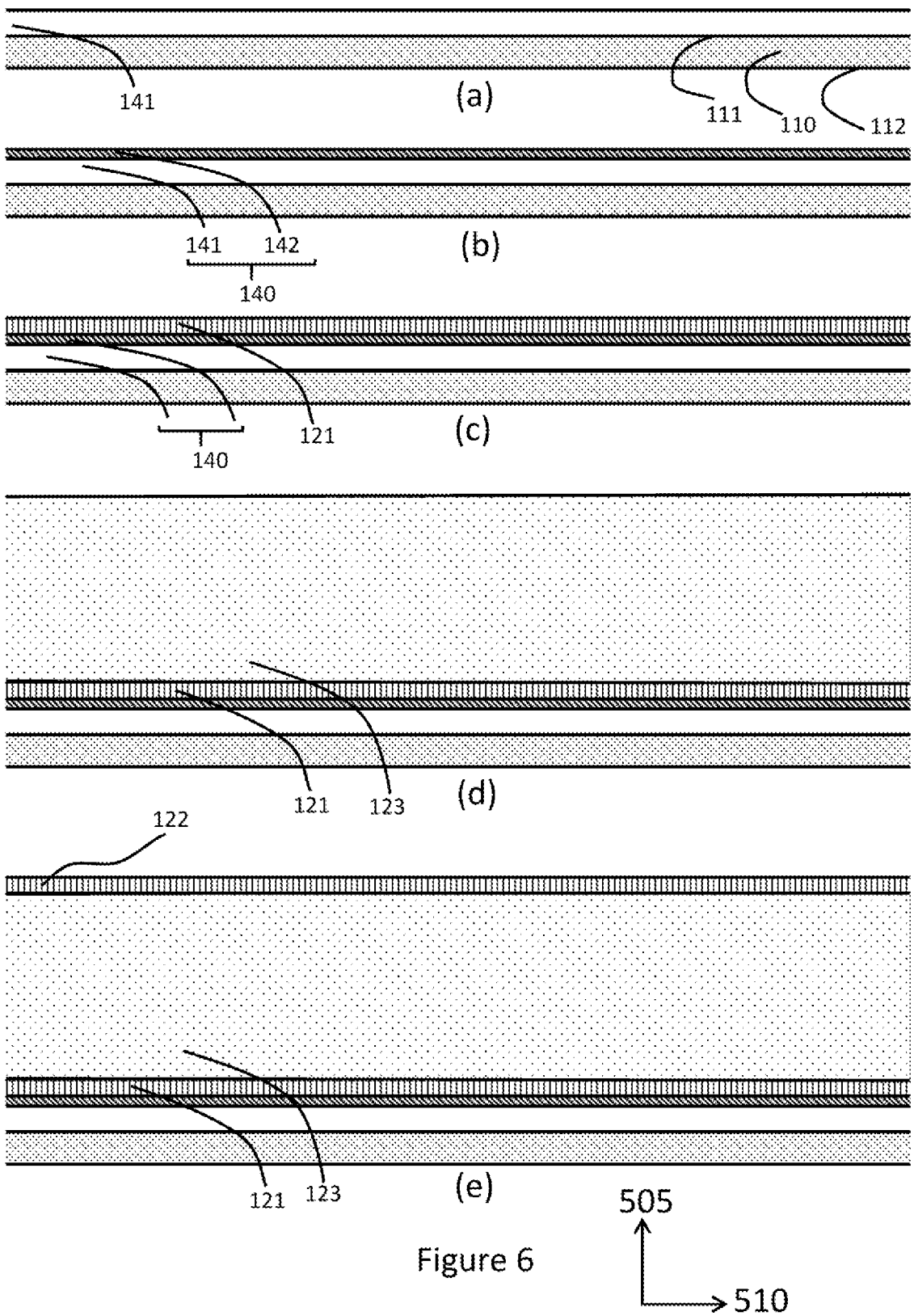
FIG. 6 depicts a series of schematic diagrams of the cross-section depicted in FIG. 1(a) of an electrical component according to a first embodiment of the disclosure at various stages during manufacture of the electrical component.
Figure 6:
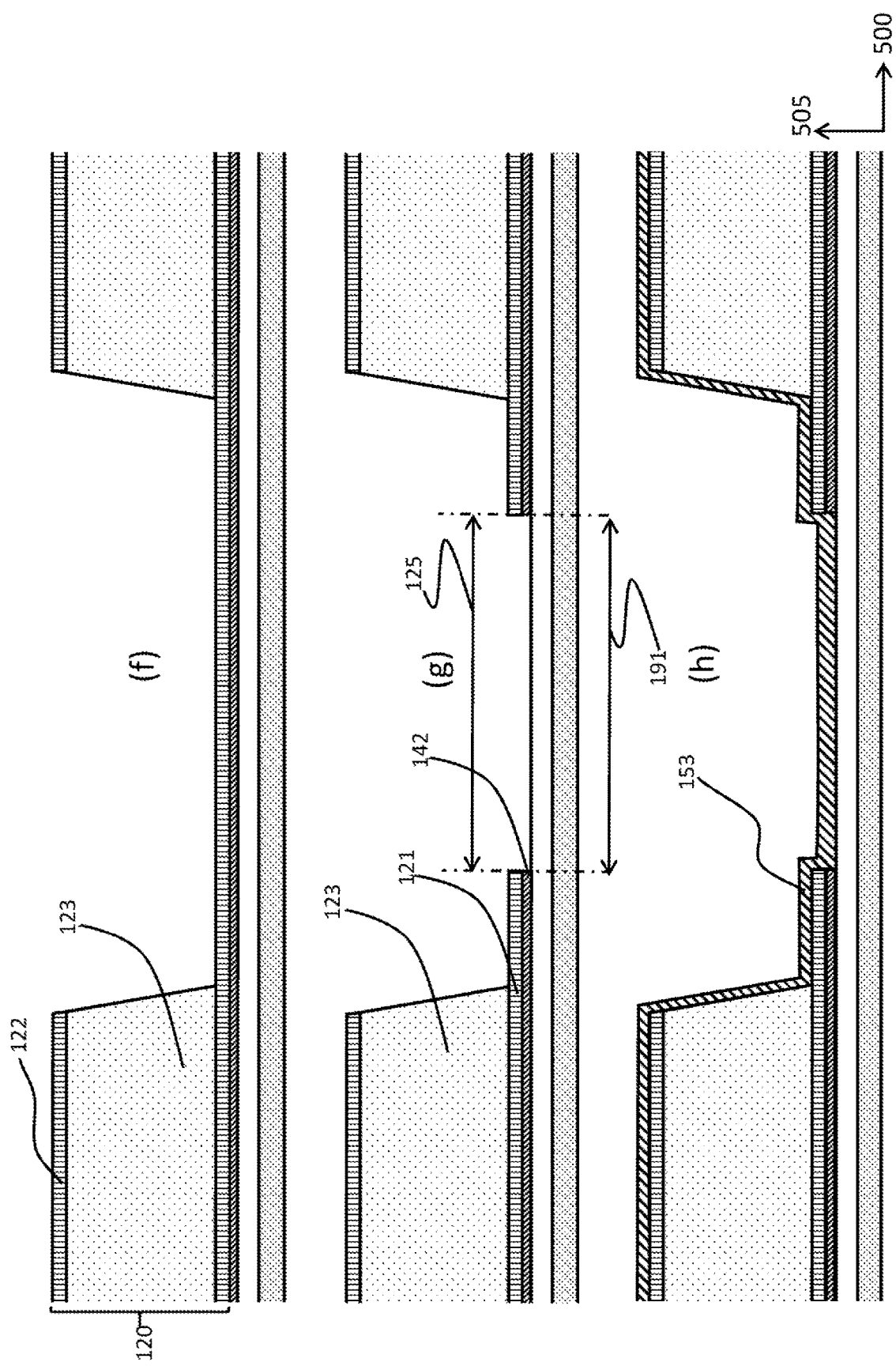
Figure 6:
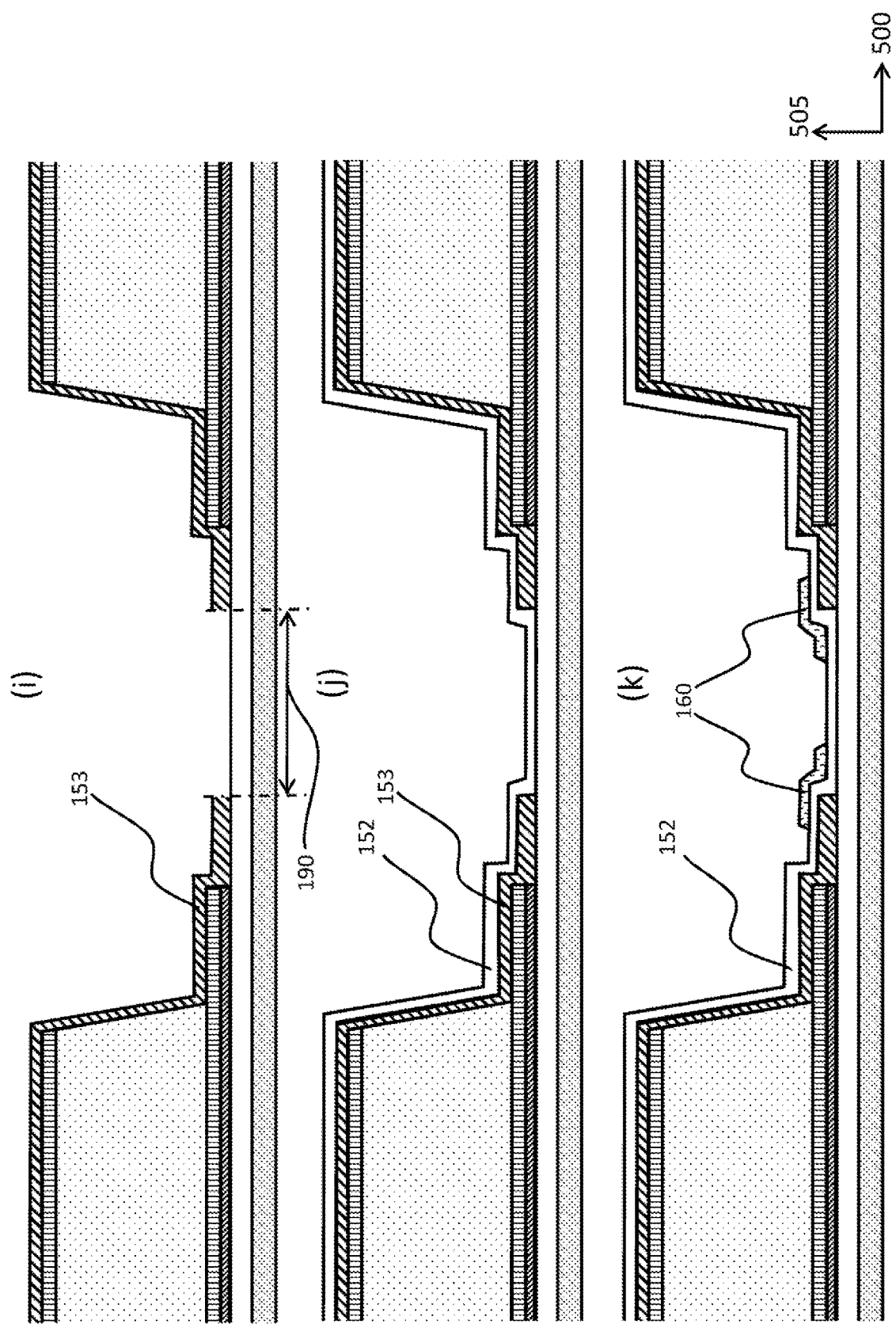
Figure 6:
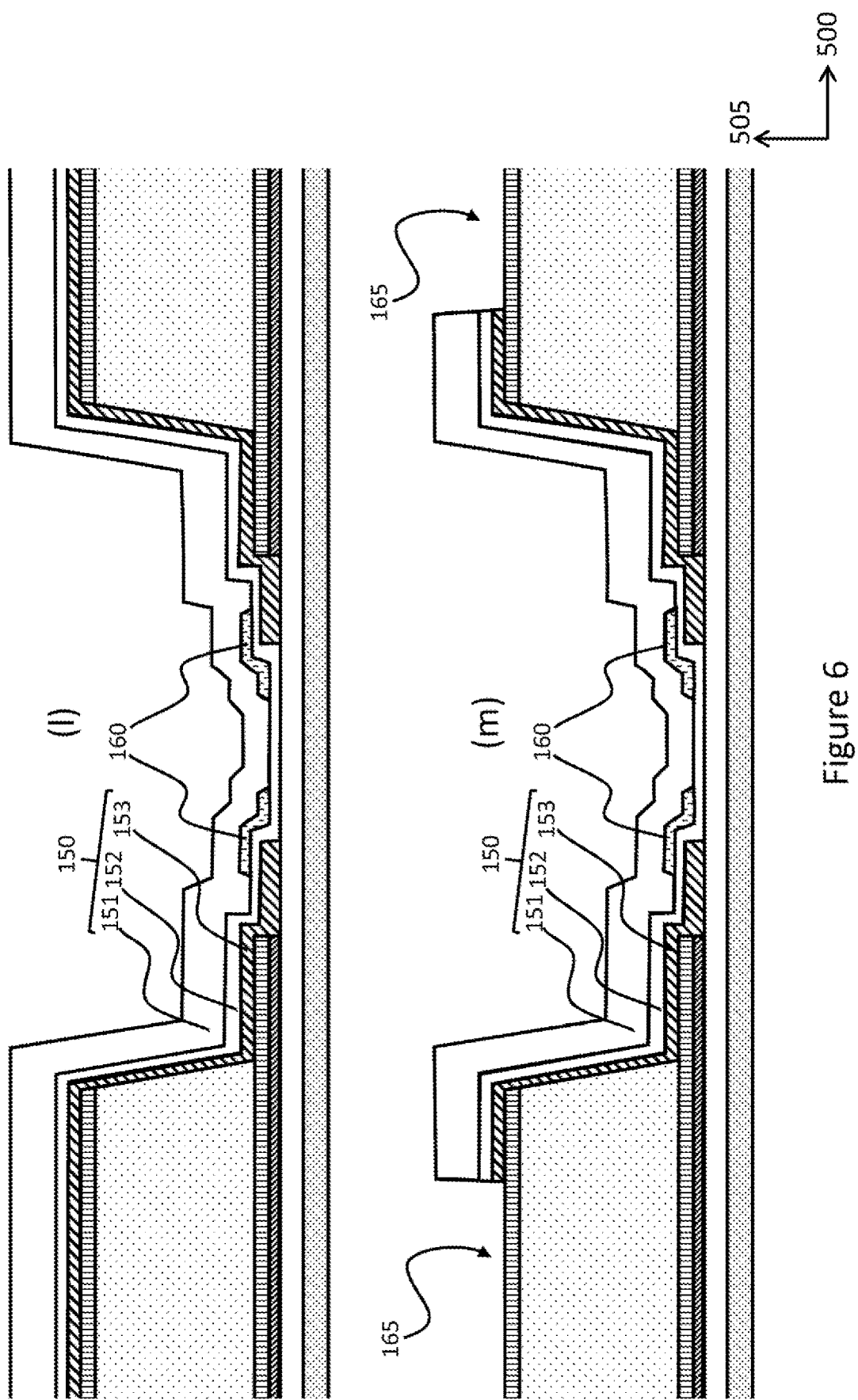

Turning now to FIG. 6 this is a schematic diagram of two electrical elements 120(i)(ii) of an electrical component 100 according to an embodiment of the disclosure, showing various stages during the manufacturing process of the electrical element 120 as depicted in detail in FIG. 1. The manufacture process starts with a substrate layer 110 comprising a first side 111 and a second side 112 which are spaced apart in the thickness direction 505. The material of the substrate is not particularly limited. In this case the substrate is a silicon wafer.

FIG. 6(a) shows the initial deposition stage in which an intermediate layer 140 is formed on the first side 111 of the substrate layer 110. The intermediate layer is formed of lower and upper intermediate layers 141 and 142 deposited on top of each other in the thickness direction 505, as shown in FIG. 6(b). The lower intermediate layer 141 disposed adjacent the substrate layer 110 is, for example, $SiO_2$ formed by thermal oxidation of the silicon wafer. The upper intermediate layer 142 is, for example, an adhesion layer made of titanium or titanium oxide or alumina.

Considering now FIG. 6(c), this shows the stack after the deposition of the first electrode 121 which is, for example, formed of platinum (Pt) and disposed adjacent the upper intermediate layer 142.

FIG. 6(d) shows the stack after the ceramic member 123 has been added on top of the first electrode 121. The thin film ceramic member is, for example, niobium (Nb) doped PZT (PNZT) deposited by sol-gel deposition, according to the following example method: i) a 15 wt. % PNZT solution (P/N/Z/T—115/2/52/48) was spin coated onto the first electrode at 3500 rpm for 45 seconds with a dynamic dispense at 500 rpm; ii) after spin-coating, the single layers were dried at 100° C. for 1 minute and pyrolysed at 300° C. for 4 minutes; and iii) the pyrolysed layers were crystallised in a rapid thermal annealer (RTA) at 700° C. for 1 minute under 2 SLPM of $O_2$ flow, with a heating rate of 10° C./s. Steps i) to iii) were then repeated until the thin film reached a suitable thickness, such as, for example 2 µm.

Next, as shown in FIG. 6(e) the second electrode 122 is layered on top of the ceramic member 123. The second electrode may, for instance, be another platinum (Pt) electrode deposited according to the same procedure as the first electrode. Alternatively, the second electrode may be compositionally different to the first electrode, for instance, a combination of iridium and iridium oxide (Ir and $IrO_2$) layers. Together the first electrode 121, the ceramic member 123 and the second electrode 122 form the electrical element 120.

As may be seen in FIGS. 6(f) and 6(g) the next steps are patterning of the second electrode 122 and the ceramic member 123 and then of the first electrode 121 together with the upper intermediate layer 142. The patterning is carried out through dry etch using chlorine ($Cl_2$) and argon (Ar) for 4 cycles and a total duration of 2 minutes. The second electrode 122 is patterned first, followed by the lower-lying PNZT 123 and first electrode 121 and upper intermediate layer 142. At the end of this step, the top view of the electrical component 100 corresponds to that seen in FIG. 3(a). As may be seen from FIG. 6(g) at the end of this step the intermediate region 125 between adjacent electrical elements 120, measured from the ends of the first electrodes 121 has been created by the patterning. Additionally the upper intermediate layer 142, disposed adjacent the electrical element, is now discontinuous such that the discontinuous region 191 has also been created and in this embodiment has the same extent in the width direction 500 as the intermediate region 125. It may be understood that in alternative embodiments, using different patterning steps, the discontinuous region 191 may be created at a different stage in the process and may then have a lesser extent than the intermediate region 125 in the width direction 500.

Next, as depicted in FIG. 6(h) a first passivation layer 153 is deposited over all of the exposed surfaces of the stack in the thickness direction 505, and over the intermediate region 125 which includes the discontinuous region 191. The passivation layer 153 in this example is an alumina layer deposited by atomic layer deposition (ALD) to a thickness of about 80 nm. Alternatively the alumina may be deposited by sol-gel methods or other techniques as would be known in the art. Alumina is a particularly preferred material for the first layer of the passivation since it has a very good adhesion to etched lead based ceramics such as PZT and doped PZT. It should be noted that at the end of this step, the top view of the electrical component will be that depicted in FIG. 3(b). Then, as depicted in FIG. 6(i), the first passivation layer 153 is patterned, for example using lithography, whereby the discontinuous region 190 is formed such the first, innermost passivation layer 153 is now discontinuous (the top view will then be that seen in FIG. 3(c)(ii)). It will be understood that this step and the formation of the discontinuous region 191 making the intermediate layer 142 discontinuous could be carried out at the same time in other embodiments and manufacture processes, in which case the discontinuous region 190 and the discontinuous region 191 would have the same extent in the width direction 500. Next, as shown in FIG. 6(j), a second passivation layer 152 is deposited. The layer 152 is made, for example, of silica and it is deposited by plasma enhanced chemical vapour deposition (PE-CVD) to a thickness of about 200 nm.

In FIG. 6(k) metal deposition is performed so that the vias 161 and 162 (not shown and their formation step not depicted) are filled in and electrical traces 160 are laid down to provide electrical connection to both the first electrode 121 and the second electrode 122. The electrical traces 160 may, for instance, be formed by sputtering aluminium (Al), gold (Au), copper (Cu), nickel (Ni) and the like or combinations thereof.

Turning now to FIG. 6(1) a third passivation layer 151 is deposited over the entire exposed surface of the stack in the thickness direction 505. The passivation layer 151 is, for example, made of silica deposited by PE-CVD to a thickness of about 500 nm. The passivation layer 151 is also deposited over the region with the metal trace 160 and entirely spans the intermediate region 125 between the electrical elements 120.

The passivation layers 151-153 are then etched over the electrical element 120. As seen in FIG. 6(m) this may provide the complete removal of the passivation layers 151-153 over the electrical element 120 so as to form a window 165 through to the second electrode 122.

In alternative embodiments, it will be understood that one or more of the outermost layers of a laminate of passivation layers 150 may be removed (or the outermost layer 151 in the thickness direction 505 may be removed) so as to form a recess 166 over the electrical element 120 as shown in FIG. 1(b) or to expose more of the electrical element 120 in regions where the traces don't extend over the electrical element 120 as shown in FIG. 1(c). The laminate of passivation layers 150 is, therefore, thinner in a thickness direction 505 across the recesses 166 compared to other non-recessed regions of the laminate of passivation layers 150. In other words the passivation layer 150, or laminate of passivation layers 150 may be recessed at a side which faces away from each of the underlying electrical elements 120 in the thickness direction 505, wherein a recess 166 is provided in each region overlying each of the plurality of electrical elements 120. Preferably the passivation 150 is initially formed by a laminate of continuous passivation layers and successively one or more outermost passivation layers are etched to form a recess 166. It will be understood that one or more of the innermost passivation layers are left overlying each of the one or more electrical elements across the recess 166 and that the first passivation layer exposed at the bottom of the recess acts as an etch stop for the removal of the outermost one or more passivation layers. Such a recess 166 in the passivation layer 150 is advantageous for substantially reducing the inhibitive effects of the passivation layer on the displacement of the electrical element during operation.

In some embodiments a recess in a laminate of passivation layers may extend in the width direction 500 to include the whole of the top surface and at least part, preferably all, of the lateral surface of each of the one or more electrical elements. This configuration is especially advantageous for reducing or avoiding any inhibitive effects of the passivation layer on the displacement of the electrical element during operation.

An exemplar embodiment is depicted in FIG. 1(c), showing a schematic diagram of a cross-section through a portion of an electrical component according to another embodiment of the disclosure where there is a discontinuous region 190 in the innermost layer of the laminate passivation layer 150 and an alternative arrangement of a recess 166 over the electrical elements. A suitably shaped mask and an etch step, as would be understood by one skilled in the art, may be used to remove all of outermost passivation layer 151 and middle passivation layer 152 over the electrical element 120 at this particular cross-section whilst retaining these layers over the electrical traces 160. It may be understood that at other cross-sections, where the electrical traces 160 extend over the electrical element 120 so as to provide an electrical connection to the second electrode 122, the shape of the mask may be altered in this region so as to retain the outermost passivation layer 151 and middle passivation layer 152 over the electrical traces 160 and over the appropriate portion of the electrical element 120. In the embodiment depicted in FIG. 1(c) the innermost passivation layer 153 has been retained over the electrical element 120 so as to provide passivation between the first electrode 121 and the second electrode 122. The innermost passivation layer 153 may have a discontinuous region 190 in the intermediate region 125.

The partial or entire removal of the passivation layer 150 over some or all of the top surface of the electrical element 120 so as to provide a recess or a window may make it lighter and more flexible and easier to deform when subject to an applied electrical field between the upper and lower electrodes. This may mean that for a given electrical field the electrical element is easier to deform, or that lower levels of electrical fields can be used to give a required amount of deformation.

Finally, as seen in FIG. 1, a continuous insulating layer 170 may be deposited over the entire exposed surface of the stack in the thickness direction 505 and over the exposed surfaces in the intermediate region 125.

The insulating layer 170 is, for example, a stack of silica ($SiO_2$) and tantala ($Ta_2O_5$) layers deposited on top of each other in a thickness direction 505 by atomic layer deposition to a total thickness of about 20 nm.

The continuous insulating layer 170 may cover any recess or window or other discontinuities or holes present in the underlying passivation layer or laminate of passivation layers associated to each of the one or more electrical elements 120 and any discontinuities present in the intermediate regions, as described above. Moreover the insulating layer 170 may substantially plug or mend the point defects present in the underlying passivation layer or outermost layer of the laminate of passivation layers so that each of the one or more electrical elements 120 and the electrical component 100 as a whole are more effectively protected from the external environment. In other embodiments the insulating layer 170, or laminate of insulating layers 170 may be selected from one or more layers of silica ($SiO_2$), hafnia ($HfO_2$), zirconia ($ZrO_2$), tantala ($Ta_2O_5$), and combinations thereof, preferably wherein the insulating layer 170 comprises a laminate of insulating layers including a plurality of silica layers and/or a plurality of tantala layers. In some embodiments the insulating layer 170 comprises a laminate of insulating layers 170 which includes a plurality of silica layers, wherein a silica layer is arranged so as to be adjacent to the electrical component 100 and wherein the laminate further comprises a plurality of tantala layers, preferably wherein the silica and tantala layers are arranged in a generally alternate manner over the thickness of the laminate.

After the deposition of the insulation layer 170, a capping layer 103 may be bonded to the electrical component 100 on the insulation layer 170 so as to encapsulate individual electrical elements 104/102 such that a plurality of cavities 106 enclose the electrical elements 104/102, as shown in FIGS. 4 and 5. Finally the substrate layer 110 may be etched in the thickness direction 505 from its second side 112 in the region adjacent to the electrical element 104/102 so as to release the intermediate layer 140 and enable it to be deformed when an electrical field is applied to the electrical element 120.

It will be understood by one skilled in the art, that additional manufacturing steps may occur in between the stages depicted in FIG. 6 so as to create other components in other locations on the substrate layer 110 and that some of these steps may be omitted or split into several sub-steps as may be required. Further, some of the stages depicted in FIG. 6 may also be omitted or split into several sub-steps as may be required. Finally it will be understood that whilst some of the layers over the base layer are described as being a single layer, MEMs fabrication techniques that are well understood in the art may mean that any or all of the single layers are themselves built up from a plurality of thinner layers.

It should be appreciated that, depending on the particular application, a variety of fluids may be ejected by droplet ejection heads. For instance, certain heads may be configured to eject ink, for example onto a sheet of paper or card, or other receiving media, such as ceramic tiles or shaped articles (e.g. cans, bottles etc.) Ink droplets may, for example, be deposited so as to form an image, as is the case in inkjet printing applications (where the droplet deposition head may be termed an inkjet printhead or, in particular examples, a drop-on-demand inkjet printhead).

Alternatively, droplet ejection heads may eject droplets of fluid that may be used to build structures, for example electrically active fluids may be deposited onto receiving media such as a circuit board so as to enable prototyping of electrical devices. In another example, polymer containing fluids or molten polymer may be deposited in successive layers so as to produce a prototype model of an object (as in 3D printing). In still other applications, droplet ejection heads might be adapted to deposit droplets of solution containing biological or chemical material onto a receiving medium such as a microarray. Droplet ejection heads suitable for such alternative fluids may be generally similar in construction to inkjet printheads, with some adaptations made to handle the specific fluid in question.

Furthermore, it should be noted that droplet ejection heads as described herein may be arranged so as to eject droplets onto suitable receiving media, and may therefore be termed "droplet deposition heads".

For instance, the receiving media could be a sheet of paper or card, ceramic tiles, or shaped articles (e.g. cans, bottles, etc.), as mentioned above, particularly with a droplet deposition head that is configured to eject droplets of ink. In another example, the receiving media could be a circuit board, for instance with a droplet deposition head that is configured to eject droplets of electrically active fluid.

Nonetheless, it is by no means essential that droplet ejection heads as described herein are arranged as droplet deposition heads, ejecting droplets onto receiving media. In some applications, it may be relatively unimportant where the ejected droplets land; for instance, in particular examples, droplet ejection heads may be utilised to produce a mist of ejected droplets in the air. More generally, similar head constructions may, in some cases, be used whether or not the ejected droplets land on receiving media. Accordingly, the more general term "droplet ejection head" is (where appropriate) used in the above disclosure.

The invention claimed is:

1. An electrical component for a microelectromechanical systems device comprising:
   i) a substrate layer;
   ii) a plurality of electrical elements adjacentlyarranged over the substrate layer, where each electrical element is separated from a neighboring electrical element by an intermediate region, each of the plurality of electrical elements comprising:
      a) a ceramic member; and
      b) first and second electrodes disposed adjacent the ceramic member such that a potential difference may be established between the first and second electrodes and through the ceramic member during operation;
   iii) a passivation layer, or a laminate of multiple passivation layers, at least partially overlying each of the plurality of electrical elements so as to provide electrical passivation between the first and second electrodes of each of the plurality of electrical elements, such that said passivation layer, or said laminate of multiple passivation layers, electrically insulates the first and second electrodes from each other;
   wherein the passivation layer, or at least an innermost layer of the laminate of passivation layers which is disposed adjacent each underlying electrical element, is discontinuous over at least one intermediate region between neighboring electrical elements of the electrical component.

2. The electrical component according to claim 1, wherein the passivation layer, or at least the innermost layer of the laminate of passivation layers, is/are discontinuous over the majority of the intermediate regions between neighboring electrical elements.

3. The electrical component according to claim 1, wherein the passivation layer, or at least the innermost layer of the laminate of passivation layers, includes a discontinuity in the form of one or more holes/apertures therein, where at least one hole/aperture is provided to coincide with an underlying intermediate region between neighboring electrical elements.

4. The electrical component according to claim 1, wherein the passivation layer, or at least the outermost layer of the laminate of passivation layers, is segmented into isolated regions, wherein each electrical element of the plurality of electrical elements has an isolated region of the segmented passivation layer at least partially overlying it.

5. The electrical component according to claim 1, wherein the electrical component comprises a laminate of multiple passivation layers, wherein all layers of the laminate are discontinuous over the majority of the intermediate regions between neighboring electrical elements, such that the majority of the intermediate regions between neighboring electrical elements have areas where there are no overlying passivation layers.

6. The electrical component according to claim 1, wherein the electrical component comprises a laminate of multiple passivation layers, wherein only the innermost layer of the laminate of passivation layers is discontinuous over the intermediate regions between neighboring electrical elements, such that one or more other layers of the laminate overlie the intermediate regions between electrical elements where the innermost layer of the laminate does not.

7. The electrical component according to claim 1, wherein the passivation layer, or laminate of multiple passivation layers, only partially overlies each of the electrical elements, the passivation layer, or at least the outermost layer of the laminate of passivation layers which is disposed adjacent each underlying electrical element, additionally being discontinuous in a region overlying each of the electrical elements.

8. The electrical component according to claim 1, wherein the passivation layer, or laminate of passivation layers, is recessed at a side which faces away from each of the underlying electrical elements, wherein a recess is provided in each region overlying each of the plurality of electrical elements, such that the passivation layer, or laminate of passivation layers, is thinner in a thickness direction across the recesses compared to other non-recessed regions of the passivation layer, or laminate of passivation layers.

9. The electrical component according to claim 1, wherein the electrical component comprises a laminate of multiple passivation layers and wherein the electrical component comprises electrical traces which connect the first and second electrodes of at least one electrical elements located at an end of the electrical component to drive circuitry, wherein the electrical traces are at least partially interposed between layers of the laminate of multiple passivation layers.

10. The electrical component according to claim 9, wherein the electrical traces at least partially interpose two adjacent passivation layers of the laminate.

11. The electrical component according to claim 1, wherein the electrical component comprises a laminate of multiple passivation layers disposed adjacent to the ceramic member and first and second electrodes of each electrical element, wherein the composition of the innermost layer of the laminate which is disposed adjacent to the ceramic member and first and second electrodes differs from the composition of at least one other layer of the laminate.

12. The electrical component according to claim 1, wherein the ceramic member and first and second electrodes of each electrical element are arranged in a stack of layers, each having lateral surfaces extending in a thickness direction, wherein the ceramic member has a first side and an opposing second side spaced apart in a thickness direction, wherein the first side of the ceramic member faces the substrate layer and the first electrode is disposed adjacent the first side of the ceramic member so as to interpose the substrate layer and the ceramic member; wherein the second electrode is disposed adjacent to the second side of the ceramic member; and wherein the passivation layer, or laminate of multiple passivation layers, at least partially overlies the second electrode and is disposed adjacent to the lateral surfaces of the ceramic member and those of the first and second electrodes of each electrical element.

13. The electrical component according to claim 1, wherein the electrical component comprises an intermediate layer interposing the electrical elements and substrate, wherein the at least one intermediate layer is discontinuous over at least one intermediate region between neighboring electrical elements of the electrical component.

14. An electrical component for a microelectromechanical systems device comprising:
  i) a substrate layer;
  ii) a plurality of electrical elements adjacently arranged over the substrate layer, where each electrical element is separated from a neighboring electrical element by an intermediate region, each of the plurality of electrical elements comprising:
    a) a ceramic member; and
    b) first and second electrodes disposed adjacent the ceramic member such that a potential difference may be established between the first and second electrodes and through the ceramic member during operation;
  iii) an intermediate layer disposed adjacent to the first electrode and at least partially interposed between each electrical element and the substrate layer; wherein the intermediate layer is discontinuous over at least one first intermediate region between neighboring electrical elements of the electrical component.

15. The electrical component according to claim 14, further comprising a passivation layer, or a laminate of multiple passivation layers, at least partially overlying each of the plurality of electrical elements so as to provide electrical passivation between the first and second electrodes of each of the plurality of electrical elements, wherein the passivation layer, or at least an innermost layer of the laminate of multiple passivation layers which is disposed adjacent each underlying electrical element, is discontinuous over at least one intermediate region between neighboring electrical elements of the electrical component.

16. The electrical component according to claim 1, wherein the electrical component is an actuator component for use in a droplet ejection apparatus.

17. The electrical component according to claim 14, incorporated in a microelectromechanical systems device and further comprising a capping layer attached to the electrical component and arranged to encapsulate each of the electrical elements of the electrical component and further comprising an insulating layer, or laminate of insulating layers, arranged over the electrical component so as to interpose the electrical component and the capping layer.

18. The electrical component according to claim 1, incorporated in a droplet ejection head.

19. The electrical component according to claim 1, incorporated in a droplet ejection head of a droplet ejection apparatus.

20. The electrical component according to claim 17, where the insulating layer, or laminate of insulating layers, is continuous and arranged so as to overlie each of the plurality of electrical elements arranged thereon.

* * * * *